United States Patent
Zuleta et al.

(10) Patent No.: US 10,958,859 B2
(45) Date of Patent: *Mar. 23, 2021

(54) SYSTEMS AND METHODS FOR IMPLEMENTING TIME DELAY INTEGRATION IMAGING TECHNIQUES IN CONJUNCTION WITH DISTINCT IMAGING REGIONS ON A MONOLITHIC CHARGE-COUPLED DEVICE IMAGE SENSOR

(71) Applicant: Planet Labs Inc., San Francisco, CA (US)

(72) Inventors: Ignacio Zuleta, San Francisco, CA (US); Adam Fritzler, San Francisco, CA (US)

(73) Assignee: Planet Labs Inc., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/841,522

(22) Filed: Apr. 6, 2020

(65) Prior Publication Data

US 2020/0336688 A1 Oct. 22, 2020

Related U.S. Application Data

(63) Continuation of application No. 15/640,305, filed on Jun. 30, 2017, now Pat. No. 10,616,516.

(Continued)

(51) Int. Cl.
*H04N 5/372* (2011.01)
*H04N 5/369* (2011.01)
(Continued)

(52) U.S. Cl.
CPC ... *H04N 5/37206* (2013.01); *H01L 27/14621* (2013.01); *H01L 27/14856* (2013.01);
(Continued)

(58) Field of Classification Search
CPC .... H04N 5/353; H04N 5/372; H04N 5/37206; H04N 9/045; H04N 9/0451;
(Continued)

(56) References Cited

U.S. PATENT DOCUMENTS 5,760,899 A * 6/1998 Eismann ............... G01J 3/2823
250/226
9,137,455 B1 9/2015 Rivard et al.
(Continued)

FOREIGN PATENT DOCUMENTS

EP 1171994 A1 1/2002
EP 3520392 A1 8/2019
(Continued)

OTHER PUBLICATIONS

Extended European Search Report for European Application No. 17857577.5, Search completed Mar. 31, 2020, dated Apr. 14, 2020, 8 Pgs.
(Continued)

*Primary Examiner* — Daniel M Pasiewicz
(74) *Attorney, Agent, or Firm* — KPPB LLP

(57) ABSTRACT

Systems and methods in accordance with embodiments of the invention implement TDI imaging techniques in conjunction with monolithic CCD image sensors having multiple distinct imaging regions, where TDI imaging techniques can be separately implemented with respect to each distinct imaging region. In many embodiments, the distinct imaging regions are defined by color filters or color filter patterns (e.g. a Bayer filter pattern); and data from the distinct imaging regions can be read out concurrently (or else sequentially and/or nearly concurrently). A camera system can include: a CCD image sensor including a plurality of pixels that define at least two distinct imaging regions, where pixels within each imaging region operate in
(Continued)

unison to image a scene differently than at least one other distinct imaging region. In addition, the camera system is operable in a time-delay integration mode whereby time delay-integration imaging techniques are imposed with respect to each distinct imaging region.

23 Claims, 19 Drawing Sheets

Related U.S. Application Data

(60) Provisional application No. 62/402,851, filed on Sep. 30, 2016, provisional application No. 62/405,120, filed on Oct. 6, 2016.

(51) Int. Cl.
*H04N 9/04* (2006.01)
*H04N 5/353* (2011.01)
*H04N 5/378* (2011.01)
*H01L 27/146* (2006.01)
*H01L 27/148* (2006.01)

(52) U.S. Cl.
CPC ....... *H01L 27/14868* (2013.01); *H04N 5/353* (2013.01); *H04N 5/3696* (2013.01); *H04N 5/378* (2013.01); *H04N 9/0451* (2018.08); *H04N 9/04553* (2018.08); *H04N 9/04557* (2018.08); *H04N 9/04559* (2018.08)

(58) Field of Classification Search
CPC ........... H04N 9/04553; H04N 9/04557; H04N 9/04559; H01L 27/14856
See application file for complete search history.

(56) References Cited

U.S. PATENT DOCUMENTS

| | | | | |
|---|---|---|---|---|
| 10,616,516 | B2* | 4/2020 | Zuleta | H04N 9/045 |
| 2003/0193589 | A1* | 10/2003 | Lareau | G01J 3/51 |
| | | | | 348/294 |
| 2006/0002634 | A1 | 1/2006 | Riley et al. | |
| 2006/0268203 | A1 | 11/2006 | Kurahashi et al. | |
| 2007/0014019 | A1 | 1/2007 | Mouli | |
| 2007/0057159 | A1 | 3/2007 | Hing | |
| 2010/0177224 | A1* | 7/2010 | Vampola | H04N 5/37206 |
| | | | | 348/295 |
| 2012/0300064 | A1* | 11/2012 | Mann | G01J 3/513 |
| | | | | 348/135 |
| 2015/0136954 | A1 | 5/2015 | Wein | |
| 2016/0014360 | A1 | 1/2016 | Dinev | |
| 2016/0276396 | A1* | 9/2016 | Tayanaka | H01L 27/14607 |
| 2018/0098014 | A1 | 4/2018 | Zuleta et al. | |
| 2019/0132541 | A1* | 5/2019 | Borremans | H04N 5/37206 |

FOREIGN PATENT DOCUMENTS

| | | |
|---|---|---|
| WO | 0057633 A1 | 9/2000 |
| WO | 2018064612 A1 | 4/2018 |

OTHER PUBLICATIONS

International Preliminary Report on Patentability for International Application PCT/US2017/054571, Report dated Apr. 2, 2019, dated Apr. 11, 2019, 9 Pgs.
International Search Report and Written Opinion for International Application No. PCT/US2017/054571, Report Completed Nov. 22, 2017, dated Dec. 15, 2017 14 pgs.
Clark et al, "Achieving Global Awareness via Advanced Remote Sensing Techniques on 3U CubeSats", Proceedings of the AIAA/USU Conference on Small Satellites, 2012, Technical Session IV: Global Missions, SSC12-IV-2. http://digitalcommons.usu.edu/smallsat/2012/all2012/31/, 11 pgs.
Inamori et al., "Attitude Control System for Arc-Second Stabilization of 30-kg Micro Astronomy Satellite", Interplanetary CubeSat Workshop, 2012.C.3.5—Navigation, Control, Tracking, and Formation for Interplanetary CubeSat Missions, 8 pgs.
Kalman et al, "MISC™—A Novel Approach to Low-Cost Imaging Satellites", Proceedings of the AIAA/USU Conference on Small Satellites, 2008, Technical Session X: Thinking Outside the Box, SSC08-X-3. http://digitalcommons.usu.edu/smallsat/2008/all2008/63/, 11 pgs.
Leijtens et al, "Active pixel sensors: the sensor of choice for future space applications", SPIE Digital Library Proceedings vol. 6744, Sensors, Systems, and Next-Generation Satellites XI; 67440V (2007);doi: 10.1117/12.735512, SPIE Remote Sensing, 2007, Florence, Italy http://www.harvestimaging.com/pubdocs/113_SPIE%20Florence%20V2.pdf, 8 pgs.
Nakasuka et al, "Small and Micro/Nano-Satellite Possibilities in Space Science and Exploration—Examples from Japan", Proceedings of the AIAA/USU Conference on Small Satellites, 2016, Technical Session 1: Science & Future Directions, TS1SCIFUTURE-3. http://digitalcommons.usu.edu/smallsat/2016/TS1SciFuture/3/, 37 pgs.
Rabinowitz et al, "Drift Scanning (Time-Delay Integration)", Michelson Summer Workshop: Discovering New Worlds Through Astrometry, Jul. 25-29, 2005, http://nexsci.caltech.edu/workshop/2005/presentations/Rabinowitz.pdf, 37 pgs.
Stanton, Eric, "Day/Night Band Imager for a CubeSat", Electrical Engineering Department, California Polytechnic State University, Jun. 2012, http://digitalcommons.calpoly.edu/eesp/172, 102 pages.
Tsitas et al., "6U CubeSat design for Earth observation with 6-5m GSD, five spectral bands and 14Mbps downlink", The Aeronautical Journal, vol. 114 No. 1161, Nov. 2010, Paper No. 3520, Manuscript received Jan. 15, 2010, pp. 689-697.
Tsitas et al., "6U CubeSat commercial applications", The Aeronautical Journal, vol. 116, No. 1175, Feb. 2012, Paper No. 3526, Manuscript received Jan. 15, 2010, pp. 189-198.

* cited by examiner

|  |  |
|---|---|
| 783 nm | 705 nm |
| 705 nm | 730 nm |

FIG. 6E

|  |  |
|---|---|
| 560 nm | 490 nm |
| 490 nm | 443 nm |

FIG. 6D

|  |  |
|---|---|
| 865 nm | 665 nm |
| 665 nm | 945 nm |

FIG. 6C

Bright broadband with short exposure

| Red | Green | PAN | PAN | NIR | Blue |

Dim narrowband with long exposure

FIG. 9C

| # | Channel | $\lambda_{min}$ [nm] | $\lambda_{max}$ [nm] | $L_{min}$ W/m²/sr/μm | $L_{ref}$ W/m²/sr/μm | $L_{max}$ W/m²/sr/μm | SNR @ $L_{ref}$ |
|---|---|---|---|---|---|---|---|
| 1 | Costal Blue | 433 | 453 | 15.97 | 129.11 | 587.87 | 129 |
| 2 | Blue | 457.5 | 522.5 | 11.7 | 128 | 615.48 | 154 |
| 3 | Green | 542.5 | 577.5 | 6.49 | 128 | 559.01 | 168 |
| 4 | Red | 650 | 680 | 3.31 | 108 | 484.13 | 142 |
| 5 | Red edge I | 697.5 | 712.5 | 2.61 | 74.6 | 449.55 | 117 |
| 6 | Red edge II | 732.5 | 747.5 | 2.06 | 68.23 | 412.92 | 89 |
| 7 | | 773 | 793 | 1.67 | 66.7 | 387.08 | 105 |
| 8 | | 784.5 | 899.5 | 0.95 | 103 | 307.8 | 174 |
| 9 | | 855 | 875 | 0.95 | 52.39 | 307.8 | 72 |
| 10 | Water Vapor | 935 | 955 | 0.51 | 8.77 | 232.91 | 114 |

FIG. 9E

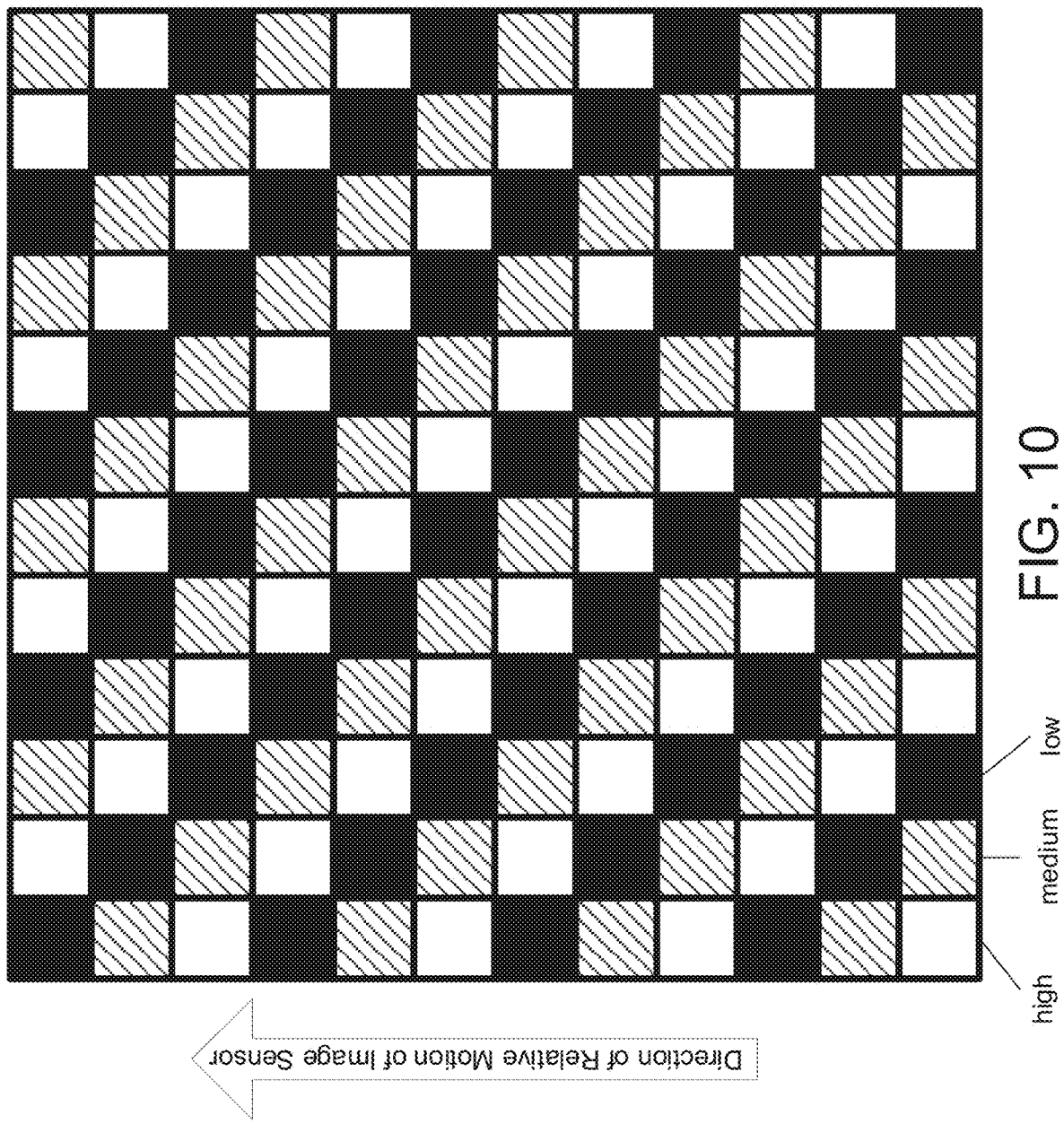

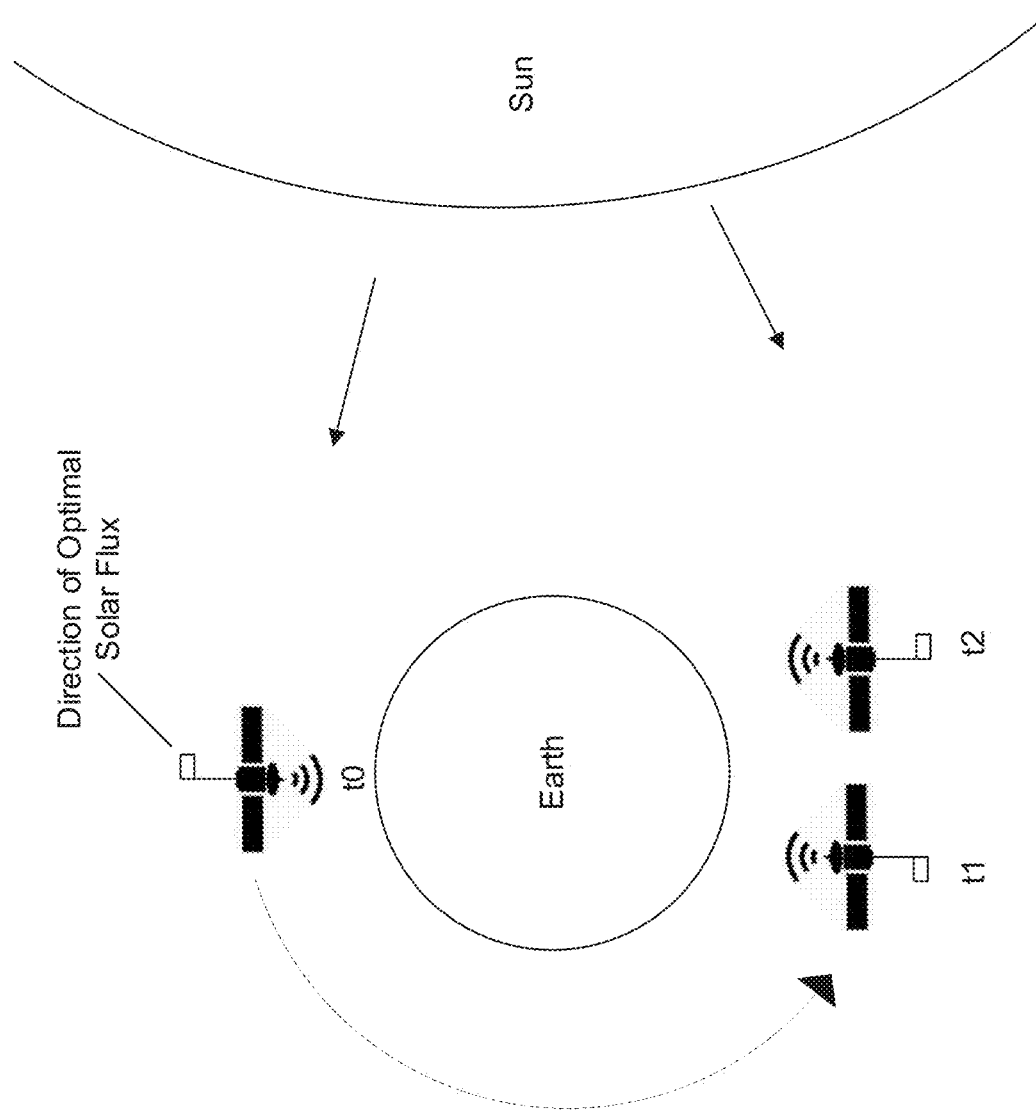

SYSTEMS AND METHODS FOR IMPLEMENTING TIME DELAY INTEGRATION IMAGING TECHNIQUES IN CONJUNCTION WITH DISTINCT IMAGING REGIONS ON A MONOLITHIC CHARGE-COUPLED DEVICE IMAGE SENSOR

CROSS-REFERENCE TO RELATED APPLICATIONS

The current application is a continuation of U.S. Non-Provisional application Ser. No. 15/640,305, entitled "Systems and Methods for Implementing Time Delay Integration Imaging Techniques in Conjunction with Distinct Imaging Regions on a Monolithic Charge-Coupled Device Image Sensor", filed Jun. 30, 2017, which claims priority under 35 U.S.C. 119(e) to U.S. Provisional Patent Application Ser. No. 62/402,851, entitled "Systems and Methods for Implementing Time Delay Integration Imaging Techniques in Conjunction with Distinct Imaging Regions on a Monolithic Charge-Coupled Device Image Sensor", filed Sep. 30, 2016 and U.S. Provisional Patent Application Ser. No. 62/405,120, entitled "Systems and Methods for Implementing Time Delay Integration Imaging Techniques in Conjunction with Distinct Imaging Regions on a Monolithic Charge-Coupled Device Image Sensor", filed Oct. 6, 2016. The disclosures of U.S. Non-Provisional application Ser. No. 15/640,305, U.S. Provisional Patent Application Ser. No. 62/402,851 and U.S. Provisional Patent Application Ser. No. 62/405,120 are hereby incorporated herein by reference in their entirety.

FIELD OF THE INVENTION

The present invention generally relates to the implementation of time delay integration imaging techniques together with custom filter arrays in the context of charge-coupled device image sensors used to track moving objects at high speed.

BACKGROUND

A variety of techniques can be utilized to image scenes in ways that capture information within different portions of the visible and/or electromagnetic spectrum. 'Color filters' are often used with a camera system to filter out portions of the electromagnetic spectrum with the exception of a specific band, such that only the particularly exempt spectral band is able to transmit through the filter. Thus, for example, a red color filter typically operates to filter out all portions of the electromagnetic spectrum except for the band corresponding with visible red light. Color filters are often implemented as patterns of filters applied to individual pixels on an image sensor. A common example of a filter pattern is the Bayer filter pattern. A Bayer filter pattern typically includes an array of red, green, and blue color filters intended to be disposed over a grid of photosensors (e.g. pixels or photosites), where each color filter is associated with a single photosensor. In a Bayer filter, there are usually twice as many green color filters as there are red or blue color filters, which is meant to mimic the physiology of the human eye. In a Bayer filter configuration, each respective photosensor is intended to obtain imaging information concerning a particular band of the electromagnetic spectrum. The aggregate of the imaging information can thereafter be 'demosaiced' or interpolated to produce a color image. Note that the term 'color filters' can also be applicable with respect to those portions of the electromagnetic spectrum adjacent to the visible light portion, e.g. the ultraviolet and infrared portions of the electromagnetic spectrum.

The quality of an image captured by an imaging system is typically dependent upon the number of photons incident on the pixels of an image sensor. A variety of techniques can be utilized to increase the intensity of light incident on an image sensor including increasing the size of the optics to capture more light and/or increasing the integration or exposure time of the pixels. The extent to which exposure time can be increased is often limited based upon relative motion between the imaging system and the scene and/or motion within the scene itself. As exposure time increases, scene motion can introduce motion blur artifacts into the resulting image.

Time delay integration (TDI) is an imaging technique that is typically implemented in conjunction with charge-coupled device (CCD) image sensors for imaging systems that move in a predictable way relative to a scene. CCD image sensors typically operate as follows: (1) a CCD image sensor typically includes a grid of pixels; (2) when an image of a scene is desired, electrical charge is stored in the grid of pixels as a function of the scene's light intensity; (3) the stored electrical charge is shifted—from one row of pixels to the next—until it reaches a serial register, where stored electrical charge corresponding with each pixel then proceeds to be read out and stored as image data. Note that in a conventional CCD imaging technique, each pixel in the grid of pixels stores light intensity information corresponding with a different aspect of the scene.

A TDI mode of operation can be useful when it is known that the scene to be imaged is moving in a known and predictable manner relative to the CCD image sensor. Whereas capturing an image in this scenario using a conventional CCD imaging technique can result in motion blur, capturing an image in this scenario using a TDI mode of operation can increase the exposure time of each resulting image pixel while mitigating the development of motion blur. In a typical TDI mode of operation, a scene being imaged is moving in an "along track" direction—corresponding with a column of pixels. Relatedly, the orthogonal direction is known as the "across track" direction—and it corresponds with a row of pixels. FIG. 1 diagrams this configuration. In effect each row of pixels 'scans' a scene such that light from a point in the scene impinges on each successive pixel of a given corresponding column. As the light impinges on each successive pixel, corresponding electrical charge is stored within the respective pixel, and the stored electrical charge is cumulatively added to each successive pixel, such that the summation is indicative of all the light that impinged on the column. As can be appreciated, because light from a single point within a scene impinges on the image sensor for a greater duration using a TDI mode of operation relative to a conventional CCD imaging technique, a TDI mode of operation can produce an image characterized by a relatively higher signal to noise ratio. In other words, TDI imaging techniques can provide for a longer exposure time since light is being aggregated due to a point in a scene being successively focused onto multiple pixels in a column of pixels due to relative motion of the camera system and the scene, allowing for more photons to be detected, and this can result in a significantly higher signal to noise ratio.

SUMMARY OF THE INVENTION

Systems and methods in accordance with various embodiments of the invention implement TDI imaging techniques in conjunction with monolithic CCD image sensors having multiple distinct imaging regions, where TDI imaging techniques can be separately implemented with respect to each distinct imaging region. In many embodiments, the distinct imaging regions are defined by color filters or color filter patterns (e.g. a Bayer filter pattern); data from the distinct imaging regions can be read out concurrently (or else sequentially and/or nearly concurrently). In order to facilitate TDI using different filter patterns, CCD image sensors in accordance with many embodiments of the invention enable shifts of multiple rows to support TDI imaging with 2 pixel×2 pixel (or larger) filter pattern mosaics. A camera system in accordance with one embodiment of the invention includes: an optical system; a CCD image sensor, itself including a plurality of pixels that define at least two distinct imaging regions; where the pixels within each distinct imaging region are configured to operate in unison to image a scene differently than at least one other distinct imaging region; a CCD image signal processor; and a microprocessor; where the optical system is configured to focus incident electromagnetic waves onto the CCD image sensor; and where the camera system is operable in a time-delay integration mode whereby time delay-integration imaging techniques are imposed with respect to each distinct imaging region.

A camera system in accordance with an additional embodiment of the invention includes: an optical system; a CCD image sensor, itself comprising a plurality of pixels that define at least two distinct imaging regions, where the pixels within each distinct imaging region are configured to image a scene differently than at least one other distinct imaging region. The camera system also includes: a CCD image signal processor; and a microprocessor. In addition, the optical system is configured to focus incident electromagnetic waves onto the CCD image sensor; and the camera system is operable in a time-delay integration mode whereby time delay-integration imaging techniques are imposed with respect to each distinct imaging region.

In a further embodiment, in a time-delay integration mode, the camera system operates to read out accumulated intensity information from each distinct imaging region by repeatedly:

accumulating intensity information in pixels within each row of pixels within a distinct imaging region;

shifting accumulated intensity information to a next row of pixels within the distinct imaging region, where a last row of pixels does not have a next row of pixels and instead shifts accumulated intensity information into an array of accumulators; and reading out accumulated intensity information from the array of accumulators.

Another embodiment also includes: an amplifier operable to amplify accumulated intensity information read out from the CCD image sensor; and an analog to digital converter operable to receive amplified accumulated intensity information, and output a digital representation of the accumulated intensity information.

In a still further embodiment, the at least two distinct imaging regions define: a first distinct imaging region configured to image a scene in a single channel; and a second distinct imaging region configured to image a scene in multiple channels.

In still another embodiment, the second distinct imaging region employs a filter pattern including color filters selected from the group consisting of at least one red color filter, at least one green color filter, at least one blue color filter, and at least one yellow color filter.

In a yet further embodiment, the second distinct imaging region includes a repeated pattern of filters.

In yet another embodiment, the repeated pattern of filters repeats a pattern of filters applied to pixels in a region of at least 2 pixels×at least 2 pixels.

In a further embodiment again, the repeated pattern of filters repeats a pattern of filters applied to pixels in a region of 2 pixels×2 pixels.

In another embodiment again, the pattern of filters applied to pixels in a region of 2 pixels×2 pixels applies the same filter to at least two of the pixels and a different filter to at least one of the pixels.

In a further additional embodiment the pattern of filters is a Bayer pattern.

In another additional embodiment, the pattern of filters comprises filters that select different wavelengths of red light.

In a still yet further embodiment, the pattern of filters comprises filters that select different wavelengths of blue light.

In still yet another embodiment, the pattern of filters comprises filters that select different wavelengths of green light.

In a still further embodiment again, the repeated pattern of filters is a repeated pattern of transmissivity filters.

In still another embodiment again, the transmissivity filters are dichroic filters.

A still further additional embodiment also includes a primary filter located between the optical system and the CCD image sensor.

In still another additional embodiment, the primary filter is a butcher block filter layer comprising a plurality of regions possessing different filtering characteristics.

In a yet further embodiment again, the repeated pattern of transmissivity filters includes filters having different transmissivity to enable high dynamic range imaging.

In yet another embodiment again, the first distinct imaging region is configured to image with a fill factor that is smaller than the fill factor of the pixels in the second distinct imaging region.

In a further additional embodiment again, at least one of the distinct imaging regions defines a third distinct imaging region configured to image near-infrared electromagnetic radiation.

In another additional embodiment again, at least one of the distinct imaging regions defines a third distinct imaging region configured to image ultraviolet electromagnetic radiation.

In another further embodiment, shifting accumulated intensity information to a next row of pixels within at least one of the distinct imaging regions comprises shifting the accumulated intensity information to an adjacent row of pixels.

In still another further embodiment, shifting accumulated intensity information to a next row of pixels within at least one of the distinct imaging regions comprises shifting the accumulated intensity information to a non-adjacent row of pixels.

In yet another further embodiment, the camera system is operable to adjust imaging parameters based upon at least one factor selected from the group consisting of received positioning information, trajectory, and field of view.

A camera system in accordance with another further embodiment again includes: an optical system; a CCD image sensor, itself comprising a plurality of pixels that define at least two distinct imaging regions, where the pixels within each distinct imaging region are configured to image a scene differently than at least one other distinct imaging region; a CCD image signal processor; a microprocessor; an amplifier operable to amplify accumulated intensity information read out from the CCD image sensor; and an analog to digital converter operable to receive amplified accumulated intensity information, and output a digital representation of the accumulated intensity information. In addition, the optical system is configured to focus incident electromagnetic waves onto the CCD image sensor; and the camera system is operable in a time-delay integration mode whereby the camera system operates to read out accumulated intensity information from each distinct imaging region by repeatedly:

accumulating intensity information in pixels within each row of pixels within a distinct imaging region;

shifting accumulated intensity information to a next row of pixels within the distinct imaging region, where a last row of pixels does not have a next row of pixels and instead shifts accumulated intensity information into an array of accumulators; and reading out accumulated intensity information from the array of accumulators.

In another further additional embodiment, the at least two distinct imaging include an imaging region having a repeated pattern of filters that repeats a pattern of filters applied to pixels in a region of at least 2 pixels×at least 2 pixels; and shifting accumulated intensity information to a next row of pixels within the imaging region having the repeated pattern of filters comprises shifting the accumulated intensity information to a non-adjacent row of pixels.

BRIEF DESCRIPTION OF THE DRAWINGS

FIGS. 6C-6E illustrate 2 pixel×2 pixel color filter patterns that can be mosaicked to form narrowband color filter patterns in accordance with certain embodiments of the invention.

FIG. 9C illustrates a monolithic CCD image sensor that includes a red region, a green region, a first panchromatic region, a second panchromatic region, a NIR region, and a blue region, each being compatible with the implementation of TDI imaging techniques in accordance with certain embodiments of the invention.

FIG. 9E is a table that conceptually illustrates various spectral bands of interest that can be selected using color filters associated with an imaging region of a monolithic CCD image sensor having multiple distinct imaging regions, each being compatible with the implementation of TDI imaging techniques in accordance with certain embodiments of the invention.

FIG. 10 illustrates a HDR (high dynamic range) transmissivity filter pattern that can be implemented on a monolithic CCD sensor characterized by multiple distinct imaging regions, each region being compatible with the implementation of TDI imaging techniques in accordance with certain embodiments of the invention.

FIG. 12 illustrates how camera systems can operate to accumulate electrical charge in accordance with a TDI imaging technique in either of two directions in accordance with many embodiments of the invention.

DETAILED DESCRIPTION

Figure 1:
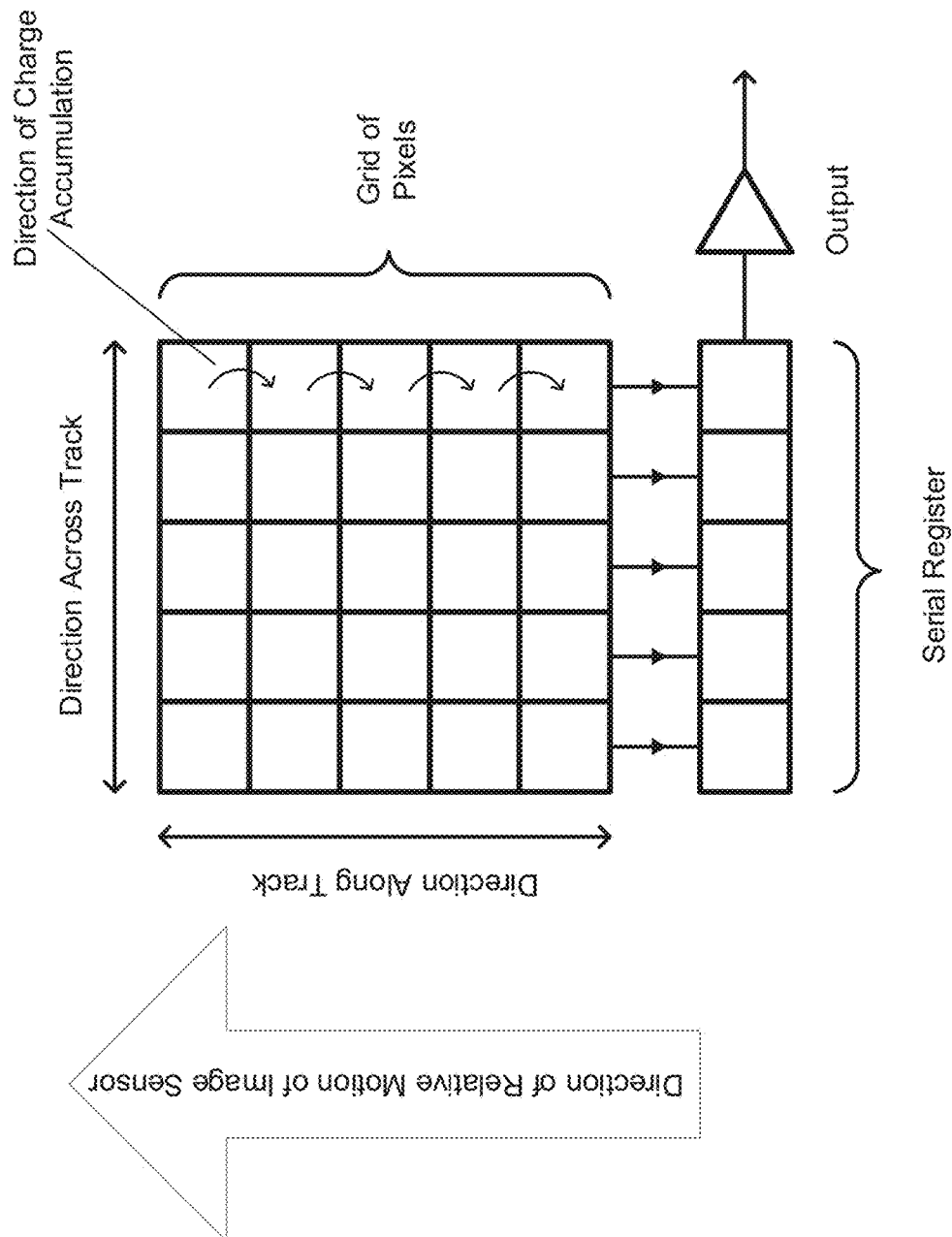
FIG. 1 illustrates the operation of a conventional TDI CCD image sensor.

Turning now to the drawings, systems and methods for implementing time delay integration (TDI) imaging techniques in conjunction with each of multiple distinct imaging regions on a monolithic charge-coupled device (CCD) image sensor are illustrated. Modern digital cameras typically implement one of two broadly categorized imaging technologies: Complementary Metal-Oxide-Semiconductor (CMOS) technology and CCD technology. The particularly implemented imaging technology for a respective digital camera is largely a function of the intended application for the camera. For example, CCD image sensors have typically been implemented in satellite imaging applications as they are generally more resilient against deleterious radiation effects relative to conventional CMOS image sensors.

Recently, there has been much interest in developing and manufacturing extremely cost-effective satellites. For example, whereas launching a conventional satellite can cost on the order of $855 million, launching a 'CubeSat' can cost on the order of $150,000. CubeSats' generally refer to a type of miniaturized satellite, often used for imaging and/or research. They generally have volumes of approximately tens of thousands of cubic centimeters, and they are often constructed using commercial off the shelf components.

As can be appreciated, digital cameras based on CCD image sensors can be well suited for implementation in a CubeSat. However, because of size and economic constraints, CubeSats can particularly benefit from the implementation of more efficient imaging techniques. Accordingly, in many embodiments of the invention, TDI imaging techniques are implemented in association with CubeSat camera systems. For example, TDI imaging techniques can be effectively implemented while a respective CubeSat orbits in a known manner—e.g. such that a targeted scene moves in a known, predictable manner—to result in the capture of image data characterized by relatively higher signal to noise ratio. While much of the discussion that follows references CubeSats, one of ordinary skill in the art can readily apprehend that the monolithic CCD image sensor having multiple distinct imaging regions, each being compatible with the implementation of TDI imaging techniques, described herein can be utilized in a variety of imaging applications including (but not limited to) larger satellite applications and applications in which the sensor is mounted to a moving aerial vehicle and terrestrial applications that image scenes moving in a predictable manner.

Notably, TDI imaging techniques have conventionally been implemented in conjunction with a single monolithic CCD image sensor, characterized by a single imaging region—e.g. a grid of pixels in association with a Bayer filter arrangement. However, a broader image data set can be efficiently captured with the implementation of a more nuanced CCD image sensor. Thus, in many embodiments of the invention, camera systems implement a monolithic CCD image sensor characterized by multiple distinct imaging regions, each of which is particularly configured to separately image a scene using different imaging characteristics, whereby TDI imaging techniques can be implemented with respect to each distinct imaging region. In this way, a diverse set of image data can be efficiently captured. For example, a monolithic CCD image sensor can include: a black and white imaging region; a color imaging region; an infrared imaging region; and an ultraviolet imaging region. In many embodiments, narrowband imaging can be performed using a mosaicked pattern of color filters that select for specific wavelengths within a narrow spectral band. When an imaged object has uniform reflectance spectrum, then the pixels in the narrowband imaging region will effectively form a monochromatic imager. When an imaged object has a reflectance spectrum that varies with wavelength, then the pixels in the narrowband imaging region can be used to capture image data with respect to specific wavelengths at a lower resolution. In several embodiments, acquired image data can be analyzed post-capture and a determination made automatically concerning the manner in which to represent the acquired data. As noted above, TDI imaging techniques can be implemented in conjunction with each such region. In many instances, TDI imaging involves simply shifting charge between adjacent pixels in the columns of a CCD image sensor. In a number of embodiments, TDI imaging involves shifting charge to pixels located multiple rows distant in the columns of the CCD image sensor. As can readily be appreciated, the specific TDI imaging configuration largely depends upon the color filters utilized with respect to a specific image sensor region and the requirements of a given application. Furthermore, shifts of different numbers of rows can be applied in different regions of the image sensor. The ability to perform TDI imaging in multiple regions of an image sensor can enable profound advantages relative to prior imaging techniques. For example, image data acquired in relation to certain of the distinct imaging regions can be correlated with scientific information e.g. the growth rates of imaged vegetation, while image data acquired in relation to another subset of the distinct imaging regions can be used to more conventionally image the scene. In this way, a scene can be imaged, and scientific data can be acquired about the scene in a 'single pass.'

In many embodiments, camera systems are operable to implement TDI imaging techniques in each of two directions (e.g. either 'up' columns of pixels or 'down' columns of pixels) for each of multiple distinct imaging regions. In this way, an associated satellite can reverse its orientation in relation to the sun (e.g. so as to orient its solar panels to enhance solar flux), and still maintain viable TDI implementation for each of the multiple distinct imaging regions.

In many embodiments, implemented TDI imaging techniques are controlled by a CCD image signal processor (which in turn is controlled by an onboard microprocessor and/or an FPGA), and the CCD image signal processor can dynamically reconfigure TDI imaging technique implementation based on context. For example, as a satellite elliptically orbits the earth, the relative motion of the earth as it is being imaged varies proportionately; accordingly, in many embodiments, the CCD image signal processor can adjust the parameters for implementing TDI imaging techniques to accommodate this variation. For instance, the rate at which accumulated charge is shifted between the rows of the CCD can be increased (i.e. overall integration time can be reduced) when the earth is moving relatively fast in the field of view of the respective camera system, and the rate at which accumulated charge is shifted between the rows of the CCD can be decreased (i.e. overall integration time may be increased) when the earth is moving relatively slow in the field of view of the respective camera system. The change in rate need not necessarily correspond to a change in integration time. In many embodiments, integration time can be controlled relative to the rate at which accumulated charge is shifted. In addition, additional rows can be provided to adjust the number of rows that contribute to the accumulated charge based upon the rate at which accumulated charge is shifted between the rows of the CCD.

For context, imaging satellite systems that can benefit from these camera systems are now discussed below in greater detail.

Imaging Satellite Systems

Figure 2:
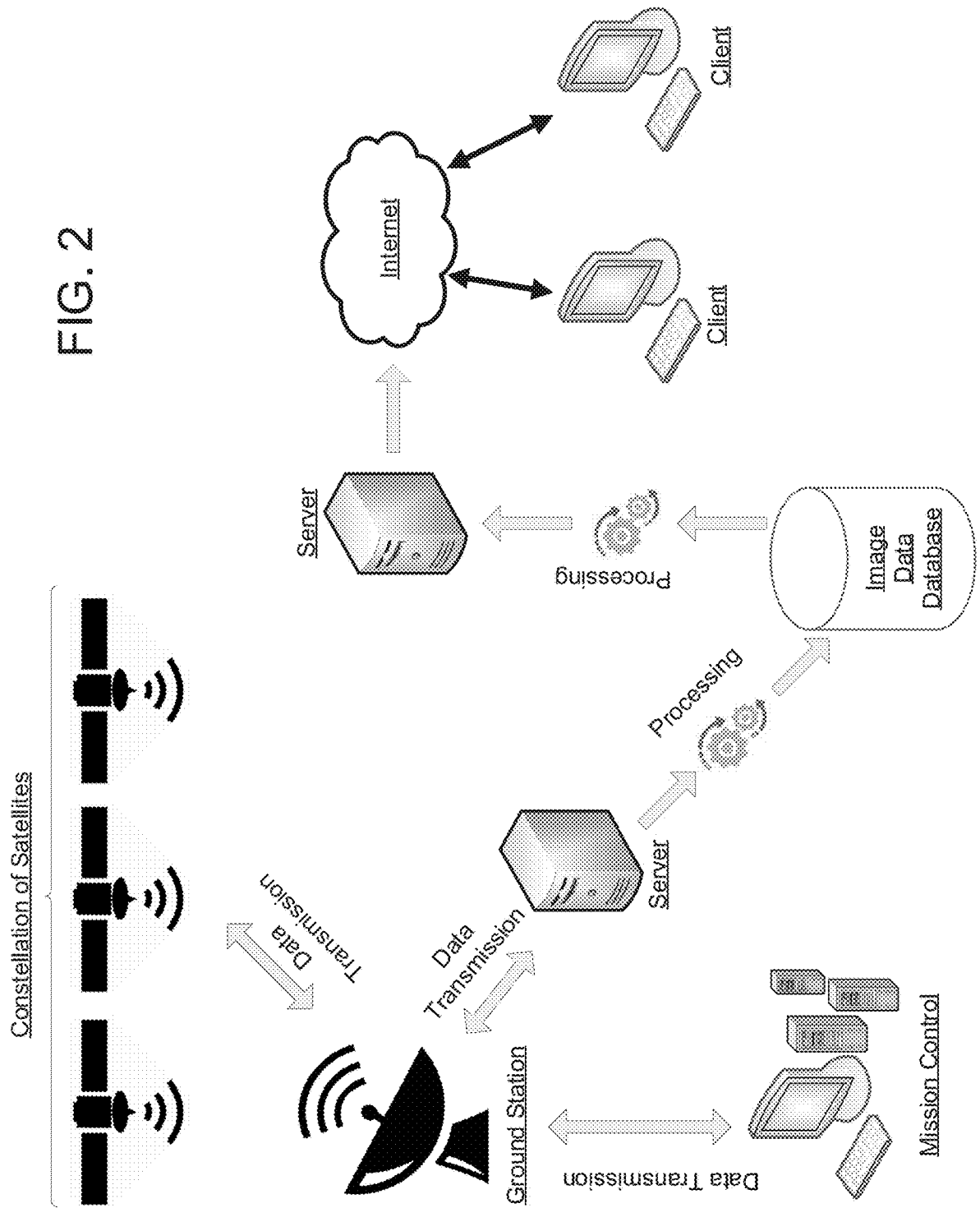
FIG. 2 illustrates a Satellite Constellation System that can benefit from the implementation of TDI imaging techniques in conjunction with monolithic CCD image sensors characterized by multiple distinct imaging regions in accordance with certain embodiments of the invention.

In many embodiments, imaging satellite systems are implemented that include a constellation of satellites, at least one of which includes a camera system that utilizes a monolithic CCD image sensor characterized by multiple different imaging regions, and operable to implement TDI imaging techniques with respect to each of the multiple different imaging regions. In many instances, such satellite constellations can be used to aggregate image data that can eventually be accessed by client devices. The satellites can interface with terrestrial systems to relay image data in any of a variety of configurations. Thus, for instance, FIG. 2 illustrates an imaging satellite system—whereby at least one satellite includes a camera system that utilizes a monolithic CCD image sensor characterized by multiple different imaging regions, and operable to separately implement TDI imaging techniques with respect to each distinct imaging region—that interfaces with a single ground station. In particular, FIG. 2 illustrates a constellation of satellites operable to collect image data. At least one satellite includes a camera system that utilizes a monolithic CCD image sensor characterized by multiple distinct imaging regions and is operable to implement TDI imaging techniques with respect to each distinct imaging region. The particulars of implementing TDI imaging techniques will be discussed in greater detail in subsequent sections. Any of a variety of satellite classes can be implemented in accordance with various embodiments of the invention. For example, in many embodiments, CubeSats are implemented. In a number of embodiments, more conventional satellites are implemented. As noted above, imaging systems in accordance with many embodiments of the invention can be mounted to any of a variety of classes of vehicle including (but not limited to) aerial vehicles and/or utilized within terrestrial applications.

FIG. 2 illustrates that the constellation of satellites interacts with a Ground Station. Thus, for instance, the constellation of satellites can relay acquired imaging data as well as respective positioning information to the Ground Station. The Ground Station can be used to communicate with the constellation of satellites generally, and more specifically to control the trajectory and operation of the various satellites within the constellation. Thus, for example, FIG. 2 illustrates that a Mission Control center can be used to interact with the Ground Station and thereby control the operation of the constellation of satellites. Mission Control can be in wireless communication with the Ground Station or in wired communication with the Ground Station.

The Ground Station can also serve to relay received image data to an image data database. As before, the Ground Station can be in wireless communication with the servers that ingest data into the image data database or wired communication with the image data database. The image data database can then store the image data for subsequent use. For instance, the image data can be retrieved and processed by a server system that provides access to the image data to any of a variety of client applications, e.g. via the Internet. While the accessing of image data over the Internet is depicted, it should be clear that image data can be accessed via any suitable network. For example, in some instances, it can be accessed over a local area network. As can be appreciated, all data communications can be encrypted for security.

The above description has provided one example of an imaging satellite system that can be implemented that utilizes monolithic CCD camera sensors, characterized by multiple different imaging regions, and operable to implement TDI imaging techniques with respect to each distinct imaging region. But it should be appreciated that such systems can be implemented in any of a variety of configurations. For example, in many embodiments, multiple ground stations can be utilized to interface with the constellation of satellites. For instance, the multiple ground stations can be located around Earth so that satellites within the constellation can always have a line of sight to at least one ground station. In many embodiments, the satellites within the constellation are operable to form a mesh network, whereby the satellites can communicate with each other. Thus, for example, satellites can relay imaging data to one another, and also to a Ground Station. This configuration can allow a satellite to relay image data to a Ground Station even if the Ground Station is not within a line of sight of a satellite. By way of example, the satellite can relay image data to a second satellite that is within line of sight of the Ground Station, and the second satellite can thereafter relay the image data to the target Ground Station. Similarly, a Ground Station can communicate with a satellite that it does not have direct line of sight to using the mesh network. In this way, a mesh network can allow for operation using relatively fewer ground stations (e.g. since the satellites can function as communication relays).

While a particular configuration has been illustrated, and variants have been discussed, it should be clear that any suitable system for implementing a constellation of satellites that implements at least one camera system that utilizes a monolithic CCD image sensor characterized by multiple distinct imaging regions, whereby TDI imaging techniques can be implemented with respect to each region, can be implemented in accordance with many embodiments of the invention. Individual satellites that can include a camera system that utilizes a monolithic CCD image sensor characterized by multiple different imaging regions, and that is operable to implement TDI imaging techniques on each of the multiple regions is discussed in greater detail below.

Satellites Including Camera Systems Utilizing Monolithic Ccd Image Sensors Having Multiple Tdi Technique-Ready Imaging Regions In many embodiments, satellites are implemented that include camera systems that utilize monolithic CCD image sensors having distinct imaging regions, where TDI imaging techniques can be implemented with respect to each distinct imaging region. Notably, the satellites can be implemented in any of a variety of form factors. For example, in many embodiments CubeSats are implemented that include the described camera systems. In a number of embodiments, the camera systems are implemented within more conventional satellites.

Figure 3:
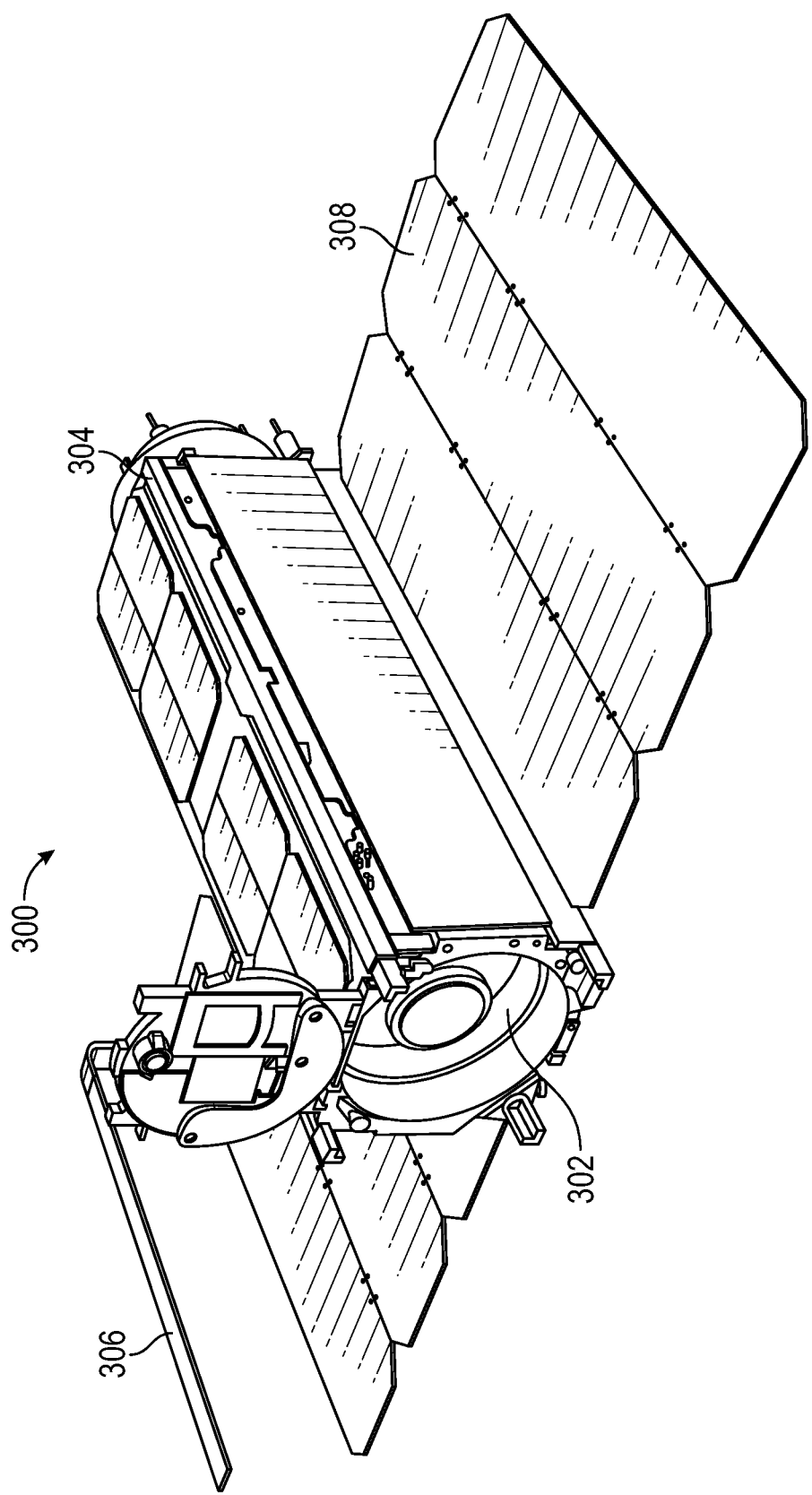
FIG. 3 conceptually illustrates a CubeSat that can be configured to include a camera system that is operable to implement TDI imaging techniques in conjunction with multiple distinct imaging regions on a monolithic CCD image sensor in accordance with certain embodiments of the invention.

FIG. 3 illustrates an example of a CubeSat that can be configured to include a camera system having a monolithic CCD image sensor characterized by multiple distinct imaging regions, where TDI imaging techniques can be implemented with respect to each distinct imaging region. In particular, it is depicted that the CubeSat 300 includes the camera system 302, a housing for the camera system 304, an antenna 306, and solar panel extensions 308. As can be appreciated, the camera system 302 can generally include the optics, a monolithic CCD image sensor characterized by multiple distinct imaging regions, and associated controllers and processors that can enable the implementation of TDI imaging techniques for each of the multiple distinct imaging regions. The particulars concerning the operation of the camera system are described in subsequent sections.

The housing 304 for the optical system can be made of any suitable material in accordance with various embodiments of the invention. In many embodiments, the housing for the optical system comprises material that is radiation resistant. In many embodiments, the housing further includes adjoined solar panels that can be used to provide additional power for the CubeSat.

As can be appreciated, the antenna 306 can allow for communication, e.g. with other satellites and/or terrestrial-based stations. The communication can be performed in accordance with any suitable protocol, including e.g. via RF communication.

As can be appreciated, the solar panel extensions 308 can comprise any suitable material in accordance with a number of embodiments of the invention. In many embodiments, the solar panel extensions 308 are compactable. Thus, as the CubeSat is being launched into outer space, the CubeSat can adopt a compacted configuration whereby the solar panel extensions 308 are folded tight against the housing for the camera system 304; and they can subsequently deploy when the CubeSat is released into orbit. As can be appreciated, this operability can enable volumetric space saving, which can subsequently allow a respective launch vehicle to carry more payload (e.g. a constellation of such CubeSats) for efficient delivery into orbit.

The alluded to camera systems including monolithic CCD image sensors characterized by multiple distinct imaging regions, which are configured to implement TDI imaging techniques with respect to each distinct imaging region, in accordance with many embodiments of the invention are now discussed in greater detail below.

Camera Systems Including Monolithic CCD Image Sensors Having Multiple TDI-Ready Imaging Regions In many embodiments, camera systems are implemented that utilize monolithic CCD imagers including multiple distinct imaging regions and are operable to implement TDI imaging techniques with respect to each distinct imaging region. Such camera systems can be implemented in a wide variety of contexts, including e.g. satellites, including CubeSats, as discussed above, and/or additional contexts including (but not limited to) telescopes, and mounting to drones, or airplanes. Accordingly, camera systems in accordance with various embodiments of the invention are not limited to any specific application.

Figure 4A:
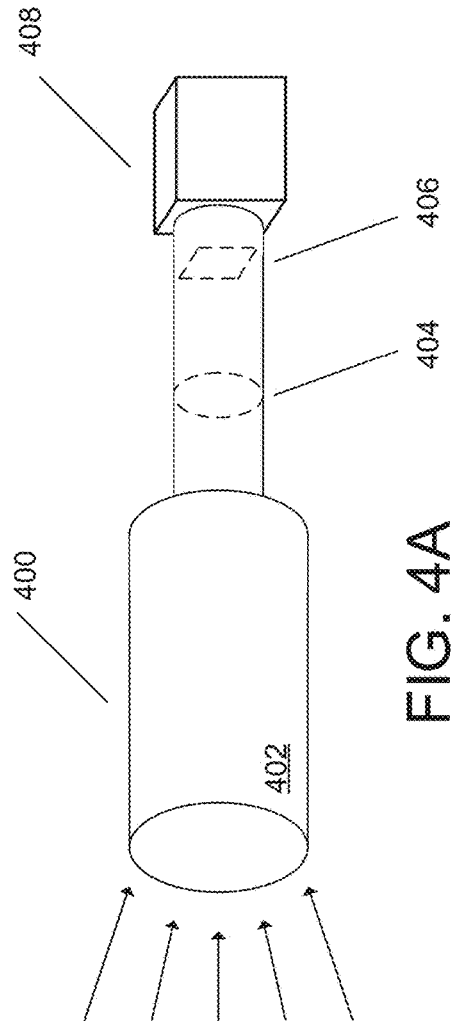
FIGS. 4A-4B illustrate a camera system that is configured to implement TDI imaging techniques in conjunction with multiple distinct imaging regions on a monolithic CCD image sensor in accordance with certain embodiments of the invention.
Figure 4B:
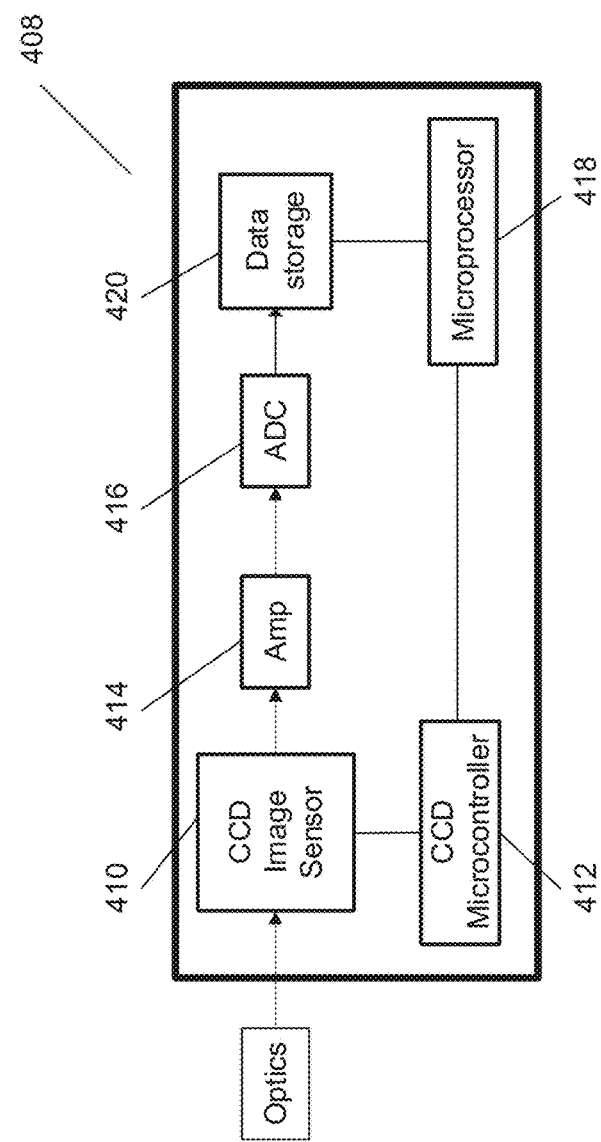

FIGS. 4A and 4B illustrate the architecture for a camera system that can be implemented in accordance with many embodiments of the invention. In particular, FIG. 4A depicts that the camera system 400 includes optics 402, a primary filter 404, a secondary filter 406, and the aggregate of the CCD image sensor and associated circuitry 408. As can be appreciated, the optics 402 can include optical element(s) that function to focus electromagnetic waves on the CCD image sensor. The primary filter 404 can function to filter out unwanted electromagnetic wavelengths. The illustrated embodiment further includes a secondary filter 406; the secondary filter 406 can function to implement e.g. a Bayer filter or any other color filter pattern as desired. The manner in which a primary filter including different regions that select different spectral bands that are then further filtered by specifically tuned filters in a secondary filter is discussed further below with reference to FIG. 6F. While several examples of the types of filters that can be implemented are mentioned, any suitable filters can be implemented in accordance with various embodiments of the invention. In some embodiments, only a primary filter is implemented. In many embodiments, no separate discrete filter is implemented. FIG. 4A further depicts the aggregate of the monolithic CCD image sensor and associated electronics 408, which are responsible for perceiving impinging electromagnetic waves.

FIG. 4B depicts in greater detail one embodiment of the aggregate of the CCD image sensor and associated electronics 408. In particular, FIG. 4B depicts that electromagnetic waves (having been filtered by the optics) impinge onto the constituent CCD image sensor 410. The CCD image sensor 410 can be controlled by a FCCD image signal processor 412. As can be appreciated, the CCD image sensor 410 can be controlled to implement TDI imaging techniques in accordance with various embodiments of the invention. In many embodiments, in implementing TDI imaging techniques, the CCD image signal processor can use positional information in computing the integration time and other imaging parameters to be implemented. For example, if the CubeSat is circumnavigating the earth in an elliptical orbit while imaging the earth, the integration time to be implemented will be different based on the position of the CubeSat relative to the elliptical orbit.

In a number of embodiments, a filter pattern is applied to an imaging region on the CCD image sensor 410 that is constructed using a mosaic of a smaller filter pattern (e.g. a 2 pixel×2 pixel pattern, a 2 pixel×3 pixel pattern, a 3 pixel×2 pixel pattern, a 3 pixel×3 pixel pattern, a 4 pixel×4 pixel pattern, and or any generalized m pixel×n pixel pattern). Where different color filters are applied to adjacent pixels in a column, the FCCD image signal processor 412 can control the shifting of accumulated charge to shift the accumulated charge by multiple rows of pixels. In this way, TDI is performed so that accumulated charge is moved within a column between pixels that share a common type of filter. In a number of embodiments, different regions incorporate different filter patterns and can be controlled so that accumulated charge is shifted by a specific number of rows dependent upon the imaging region. The implementation of TDI imaging techniques with respect to each of multiple distinct imaging regions are discussed in greater detail below.

In many embodiments, an amplifier 414 is implemented to amplify the signal output by the CCD image sensor. The amplified signal can then be sent to an analog to digital converter 416 that can convert the signal to a digital form. The digital data can then be stored in data storage 420. In many embodiments, the data can be encoded using a lossy or lossless encoding prior to storage of the encoded data. In particular, it is illustrated that a microprocessor 418 can be used to control the operation of the data storage as well as the operation of the CCD image signal processor. The image data can then be relayed to a ground station via an associated antenna (not shown) for subsequent consumption.

While a specific camera system architecture has been illustrated and discussed, camera systems having CCD image sensors characterized by multiple distinct imaging regions and operable to implement TDI imaging techniques with respect to each of the distinct regions can be implemented in any of a variety of ways in accordance with various embodiments of the invention. The implementation of distinct imaging regions within monolithic CCD image sensors, and the implementation of TDI imaging techniques with respect to each imaging region in accordance with many embodiments of the invention is discussed below.

TDI Imaging Techniques with Respect to Each of Multiple Distinct Imaging Regions in a Monolithic CCD Image Sensor In many embodiments, monolithic CCD image sensors that include multiple distinct imaging regions, whereby TDI imaging techniques can be utilzied with respect to each distinct imaging region, are implemented. Such sensors can be implemented to efficiently acquire a diverse and robust set of image data. Notably, any of a variety of distinct imaging regions can be implemented in accordance with various embodiments of the invention. Within the context of CCD image sensors, a distinct imaging region can be understood to be a grid of pixels that are configured to separately image a scene according to a set of imaging parameters, and which can support the viable and sensible application of TDI imaging techniques. As an example, imaging regions can be defined by filters and/or a filter pattern. For instance, a grid of pixels can be associated with infrared color filter(s) and an adjacent grid of pixels can have different imaging characteristics including use of a different color filter and/or filter pattern. The differences in imaging characteristics including (but not limited to) the color filters and/or filter patterns can define a distinct imaging region. In many instances, an imaging region is defined by a grid of pixels to which a Bayer filter pattern is applied. Thus, a CCD image sensor may include a first imaging region characterized by a Bayer filter pattern, and a second imaging region characterized by an ability to image the infrared portion of the electromagnetic spectrum. Importantly, data from the distinct imaging regions can be read out concurrently (or else sequentially and/or nearly concurrently). In many embodiments, the CCD image sensor includes multiple ports and an external microcontroller and or FPGA is able to read out the accumulated intensity information from a row of pixels in each of the distinct regions during the time each row of pixels is exposed prior to shifting accumulated intensity information to a next row of pixels.

Moreover, the different imaging regions can be characterized by varying 'heights,' i.e. different imaging regions can be characterized by different numbers of rows of pixels. More in detail, a distinct imaging region that includes more rows can be associated with a longer integration time, i.e. electric charge is accumulated over more rows of pixels. Thus, for instance, if one of the distinct imaging regions is generally not as sensitive to incident electromagnetic radiation and/or less photons within a portion of the electromagnetic spectrum are incident on the image sensor, the region that images that portion of the electromagnetic spectrum can have more rows to allow for a longer integration time.

When a filter pattern is used within an imaging region in which different filters are applied to adjacent pixels within a column, the CCD can be configured to shift accumulated charge by multiple rows at a time so as to skip over pixels having different filters. As different regions can have different filter patterns, the CCD can be controlled to apply different shifts in different regions. Furthermore, the integration time can be determined as both a function of the number of rows within a region and the number of rows by which accumulated charge is shifted.

Figure 5:
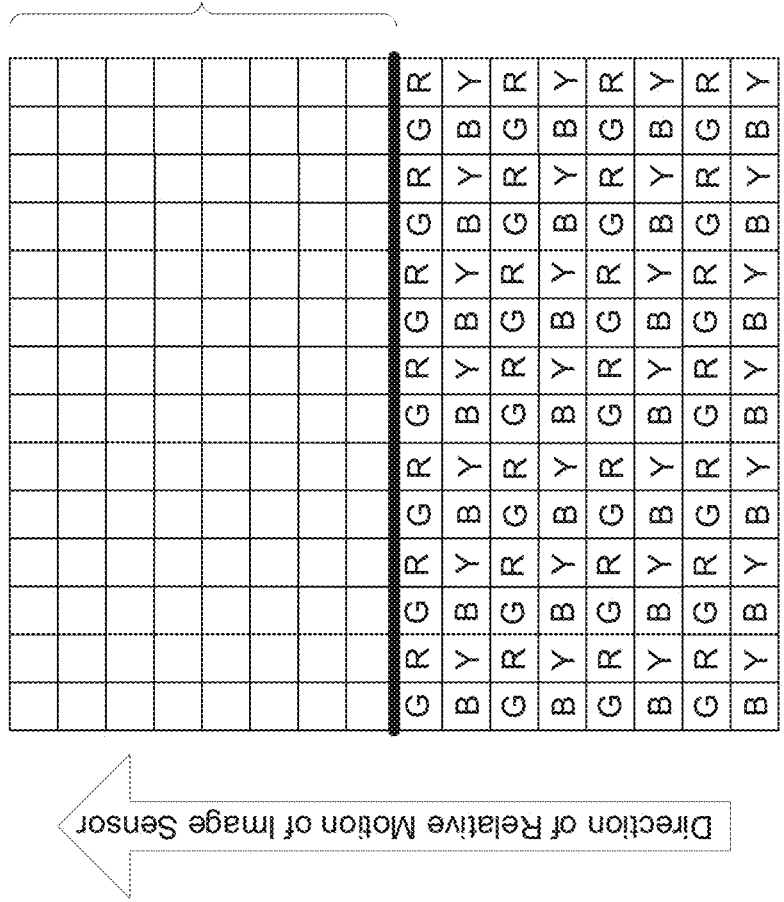
FIG. 5 illustrates a monolithic CCD image sensor that includes a monochrome imaging region and a RGB-NIR, or red-green-blue-near infrared, color imaging region, each being compatible with the implementation of TDI imaging techniques in accordance with certain embodiments of the invention.

FIG. 5 illustrates a monolithic CCD image sensor divided equally into two distinct imaging regions: a monochrome region and an RGB-NIR region, in accordance with an embodiment of the invention. The CCD image sensor can be configured such that each distinct region can image a respective scene separately, and TDI imaging techniques can be implemented with respect to each distinct imaging region. As alluded to above, by including multiple distinct regions, relatively more diverse, information-rich image data can be obtained.

Importantly, while TDI imaging techniques can be performed on the monochrome region relatively straightforwardly, implementing TDI imaging techniques on the RGB-NIR region depicted in FIG. 5 may require more nuance. In particular, rather than accumulating electrical charge from each pixel in a respective column, the electrical charge from pixels in alternating rows, which correspond to the same color filter (e.g. green), may be aggregated to prevent the blurring of different color information.

Figure 6A:
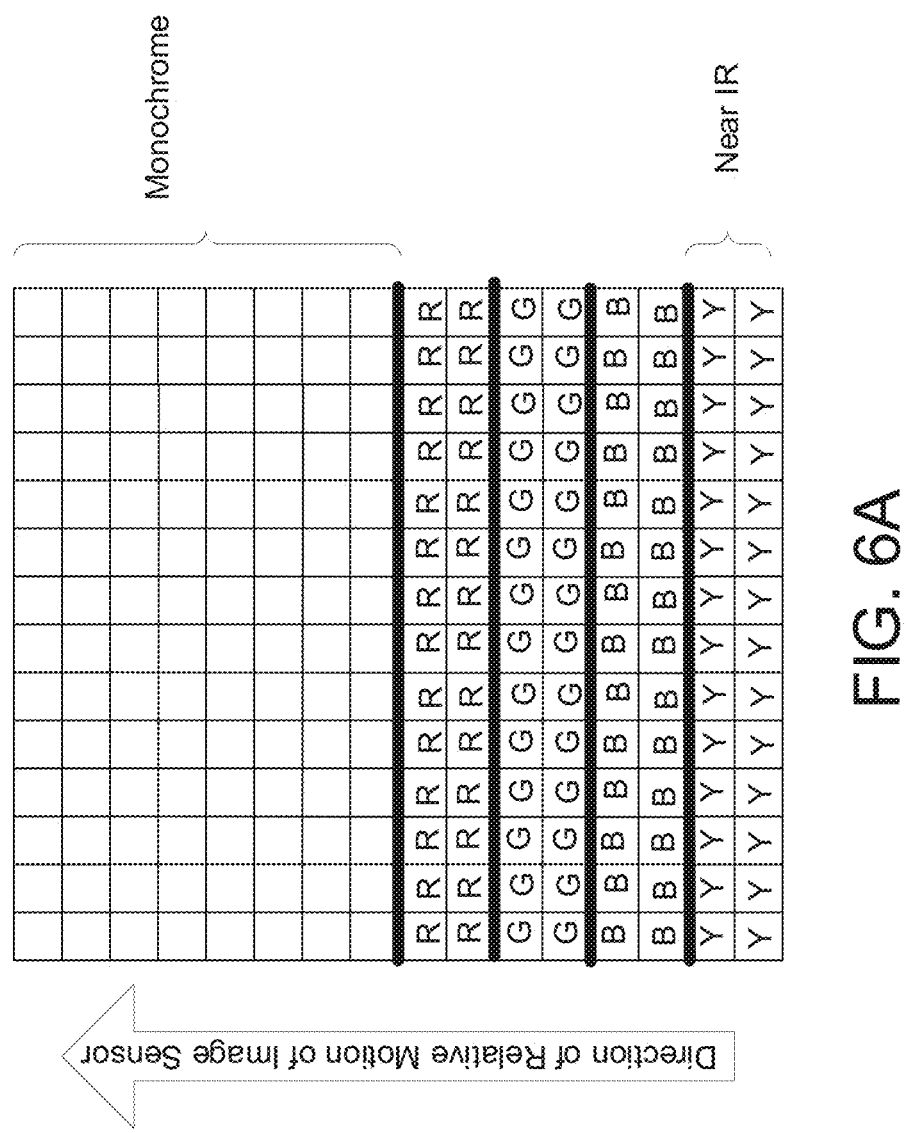
FIG. 6A illustrates a monolithic CCD image sensor that includes a monochrome region, a red imaging region, a green imaging region, a blue imaging region, and a yellow imaging region, each being compatible with the implementation of TDI imaging techniques in accordance with certain embodiments of the invention.

In some embodiments, to obtain color information without having to implement these nuanced TDI-imaging techniques, red, green, blue, and near infrared color filters define their own respective imaging regions. Thus, for instance FIG. 6A illustrates an embodiment that includes five distinct imaging regions: a monochrome region, a red region (R), a green region (G), a blue region (B), and a near-infrared region (Y). As can be appreciated from the discussion above, TDI imaging techniques can be implemented with respect to each of the five distinct regions. In this configuration, electrical charge from each pixel within a column of a respective region can be aggregated in accordance with TDI imaging technique principles (as opposed to aggregating only those in alternating rows). Separating the different spectral bands into different regions can involve tradeoffs. The separation increases resolution, however, it can decrease integration time relative to the same number of rows of pixels. In addition, the separation can necessitate readout of accumulated intensity information from more rows of pixels during the time period in which each row of pixels accumulates intensity information.

Figure 6B:
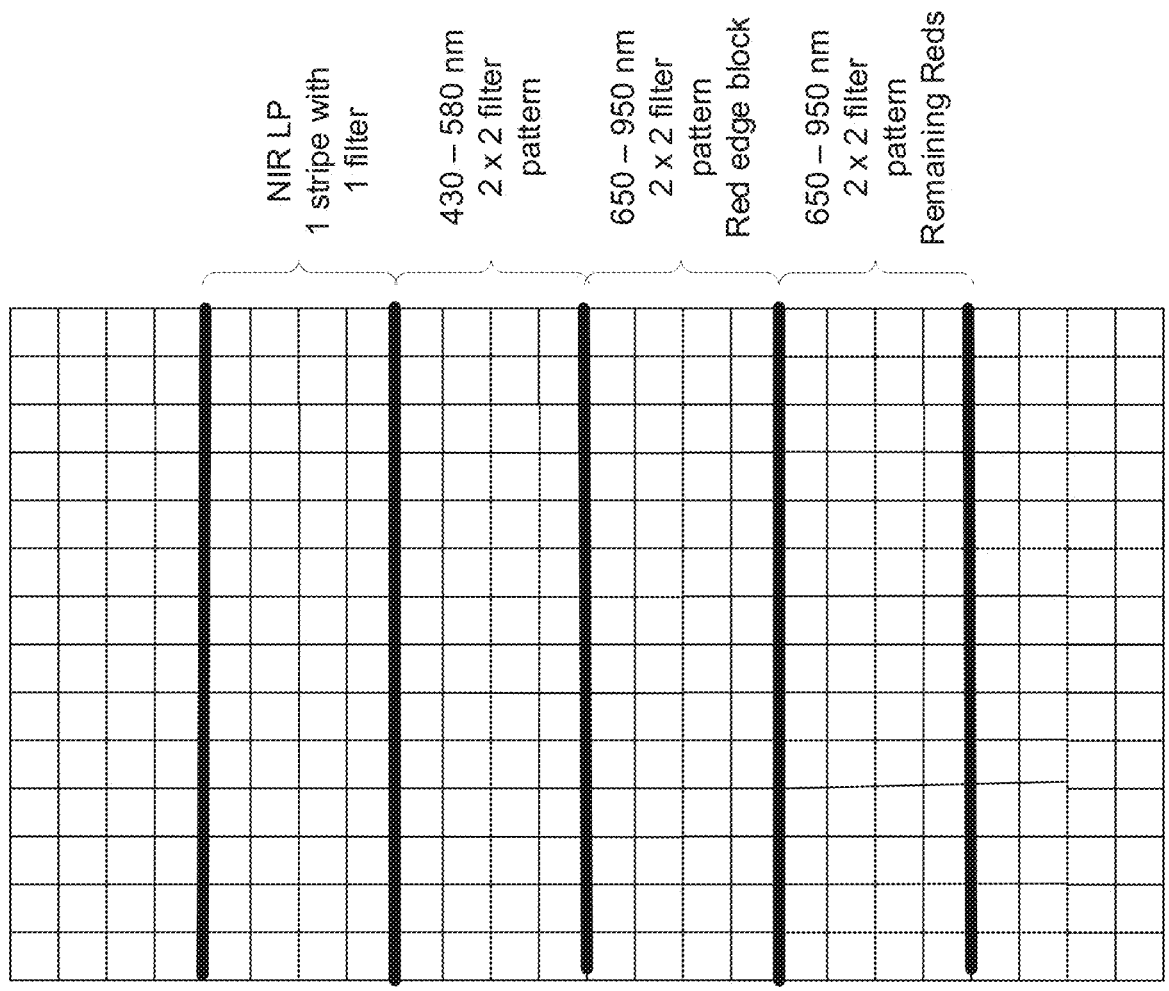
FIG. 6B illustrates a monolithic CCD image sensor that includes multiple narrowband imaging regions patterned with a mosaic of color filters formed using a 2 pixel×2 pixel color filter pattern, where each narrowband imaging region is compatible with the implementation of TDI imaging techniques in accordance with certain embodiments of the invention.

In many embodiments, an ability to image within a specific spectral band and to provide image data with respect to specific wavelengths of interest within a spectral band can be achieved by patterning an imaging region with a pattern of color filters. A CCD image sensor in which multiple image regions are defined based upon specific 2 pixel×2 pixel patterns of filters in accordance with an embodiment of the invention is illustrated in FIG. 6B. In the illustrated embodiment, a near infrared region is provided in which a single type of filter is applied to each pixel within the imaging region. A 430-580 nm imaging region is also provided in which a 2 pixel×2 pixel pattern of filters is utilized to image specific wavelengths within the 430-580 nm spectral band. An example of a pattern of color filters that can be applied to a 2 pixel×2 pixel array of pixels within a 430-580 nm imaging region in accordance with an embodiment of the invention is shown in FIG. 6D. The 2 pixel×2 pixel array includes two pixels to which a 490 nm filter is applied, a single pixel having a 560 nm filter, and a single pixel having a 443 nm filter.

Referring again to FIG. 6B, the CCD image sensor also includes a 650-950 nm imaging region in which a 2 pixel×2 pixel pattern of filters is utilized to image specific wavelengths within the 650-950 nm spectral band to image wavelengths at the edges of the red spectral band. An example of a pattern of color filters that can be applied to a 2 pixel×2 pixel array of pixels within a 650-950 nm imaging region in accordance with an embodiment of the invention is shown in FIG. 6C. The 2 pixel×2 pixel array includes two pixels to which a 665 nm filter is applied, a single pixel having a 865 nm filter, and a single pixel having a 945 nm filter. The CCD image sensor also includes a 650-950 nm imaging region in which a 2 pixel×2 pixel pattern of filters is utilized to image specific wavelengths within the 650-950 nm spectral band to image other wavelengths in the red spectral band. An example of a pattern of color filters that can be applied to a 2 pixel×2 pixel array of pixels within a 650-950 nm imaging region in accordance with an embodiment of the invention is shown in FIG. 6C. The 2 pixel×2 pixel array includes two pixels to which a 705 nm filter is applied, a single pixel having a 783 nm filter, and a single pixel having a 730 nm filter.

As noted above, the advantage of using filters within a spectral band that select for specific wavelengths of light is that the image sensor can image objects that have a uniform reflectance spectrum at a high resolution (i.e. at a sampling rate defined by the pixel pitch of the sensor). In addition, the image sensor can also capture image data concerning the reflectance of specific informative wavelengths when imaging objects that have reflectance spectrums that vary meaningfully with wavelength. The extent to which variation in reflectance yields meaningful information can be ascertained during post processing by performing 2D Fourier analysis of the frequency spectrum of the captured data. Objects that have reflectance spectrums that vary with wavelength will tend to have frequency spectra with side lobes. When side lobes satisfying a predetermined criterion are present, the system can flag to the user and/or present the user with a visualization of the captured image data that highlights the different wavelengths within a spectral band. When the criterion is not satisfied, a blind deconvolution can be performed to present the image data at the resolution of the image sensor. In several embodiments, processing circuitry within the camera system performs a transformation such as, but not limited to, a discrete cosine transformation during the encoding of the image data that can be further utilized to evaluate the spectral characteristics of the acquired image data. In other embodiments, the spectral characteristics of the acquired image data can be determined post capture and on a remote system.

In a number of embodiments, an optical system utilized with a CCD image sensor in which a region employs a filter pattern similar to those described above is designed to have a Q, which is a function of the focal length of the optics and the pixel pitch of the senor, of approximately 1. When the narrowband imaging region of the image sensor acts as a monochromatic imaging region, the electro-optical imaging system has a Q of approximately 1. When the narrowband imaging region of the image sensor acts as an imaging region with pixels that image multiple wavelengths within the narrowband based upon the pattern of filters (due to the variation in the reflectance spectrum of an imaged object), then the electro-optical imaging system has a Q that is determined by the size of the filter pattern. For example, a 2×2 filter pattern can have a Q of approximately 0.5. As can readily be appreciated, the characteristics of an electro-optical imaging system formed by an optical system and a CCD image sensor is largely dependent upon the requirements of a given application. Furthermore, CCD image sensors are not limited to filters tuned to select the specific wavelengths described above. Any of a variety of filter patterns including 2 pixel×2 pixel, 2 pixel×3 pixel, 3 pixel×2 pixel, 3 pixel×3 pixel, 4 pixel×4 pixel and/or any other filter arrangements that select for any of a number of different wavelengths that are appropriate to the requirements of a given application can be utilized in accordance with various embodiments of the invention.

Figure 6F:
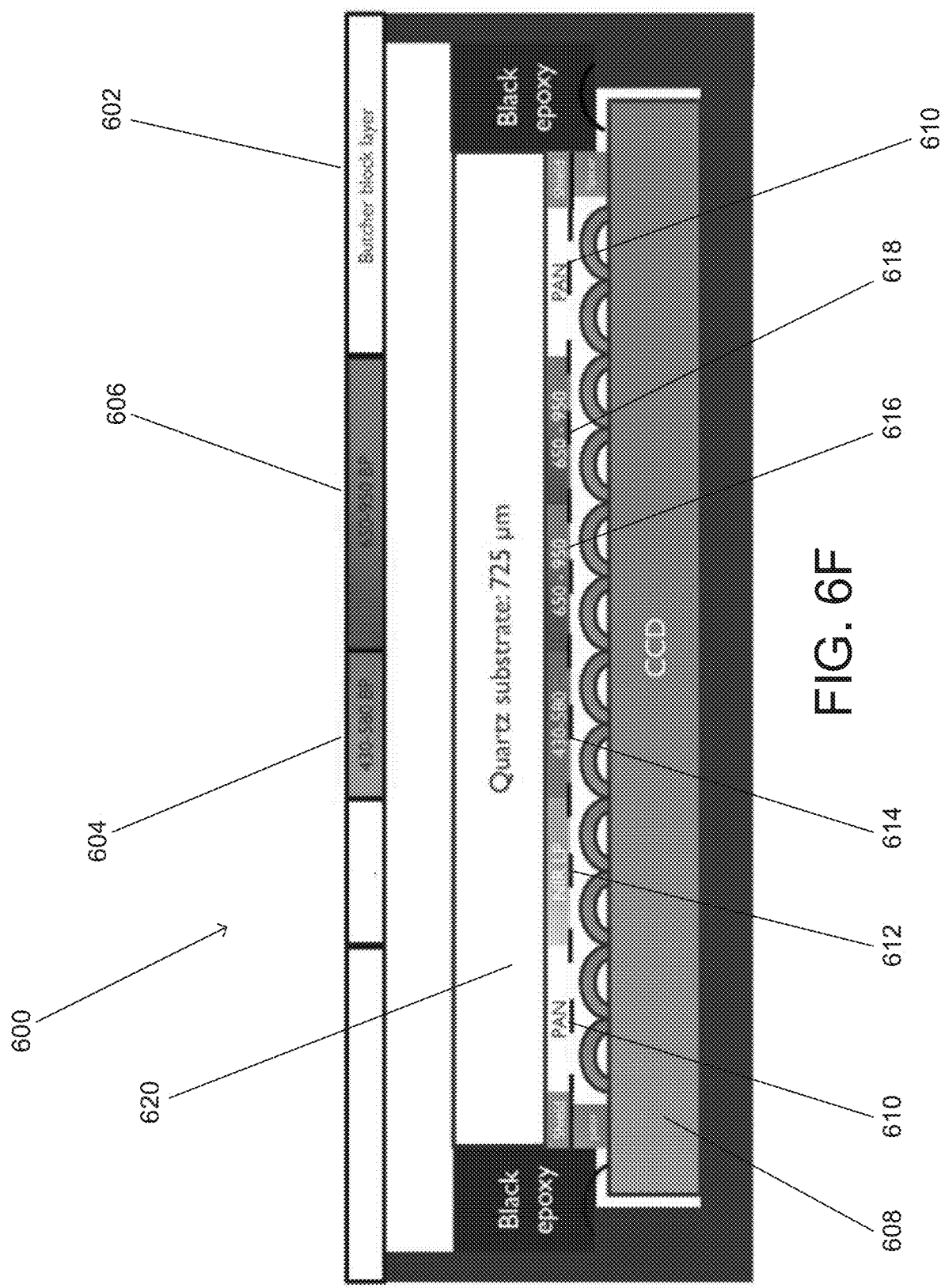
FIG. 6F illustrates an image sensor incorporating a butcher block color filter layer positioned above a monolithic CCD image sensor and dichroic mirror filters formed on a substrate positioned above pixels of the CCD image sensor in accordance with certain embodiments of the invention.

In a number of embodiments, filter patterns are applied to a CCD image sensor using dichroic films. In many embodiments, a primary butcher block filter is paired with the secondary dichroic films so that the light incident on the dichroic films in band limited. In this way, the butcher block filter can restrict the spectral band of incident radiation and the specific dichroic filter applied to an individual pixel can selectively admit a narrowband of light to the pixel. A CCD image sensor incorporating a primary butcher block filter and a secondary filter constructed using dichroic mirrors in accordance with an embodiment of the invention is illustrated in FIG. 6F. The CCD image sensor assembly 600 includes a butcher block filter layer 602 incorporating a number of different color filter regions that filter incident radiation to pass a specific spectral band. In the illustrated embodiment, the butcher block filter layer 602 includes a first filter region 604 configured to pass a spectral band of 430-580 nm and a second filter region 606 configured to pass red light in a spectral band of 650 nm to 950 nm. Radiation filtered by the butcher block filter layer 602 is incident upon a CCD image sensor relative to which filter patterns are formed using dichroic mirrors creating imaging regions similar to those illustrated in FIG. 6B. In the illustrated embodiment, the dichroic mirrors form PAN filtering regions 610, a near infrared imaging region 612, a 430-580 nm imaging region 614, a first 650-950 imaging region 616, and a second 650-950 nm imaging region 618. The second filter region 606 of the butcher block filter layer 602 acts as a primary filter for both imaging regions 616 and 618 that image in the 650 nm-950 nm band. In the illustrated embodiment, the dichroic mirror color filters are formed on a quartz substrate that is aligned with the CCD image sensor 608.

While a specific CCD image sensor assembly, and variations thereof, are described above with reference to FIG. 6F, any of a variety of image sensor assemblies can be constructed including CCD image sensors including a single or multiple layers of filters and/or any of a variety of imaging regions and/or filter types or configurations can be utilized as appropriate to the requirements of specific applications in accordance with various embodiments of the invention.

Figure 7:
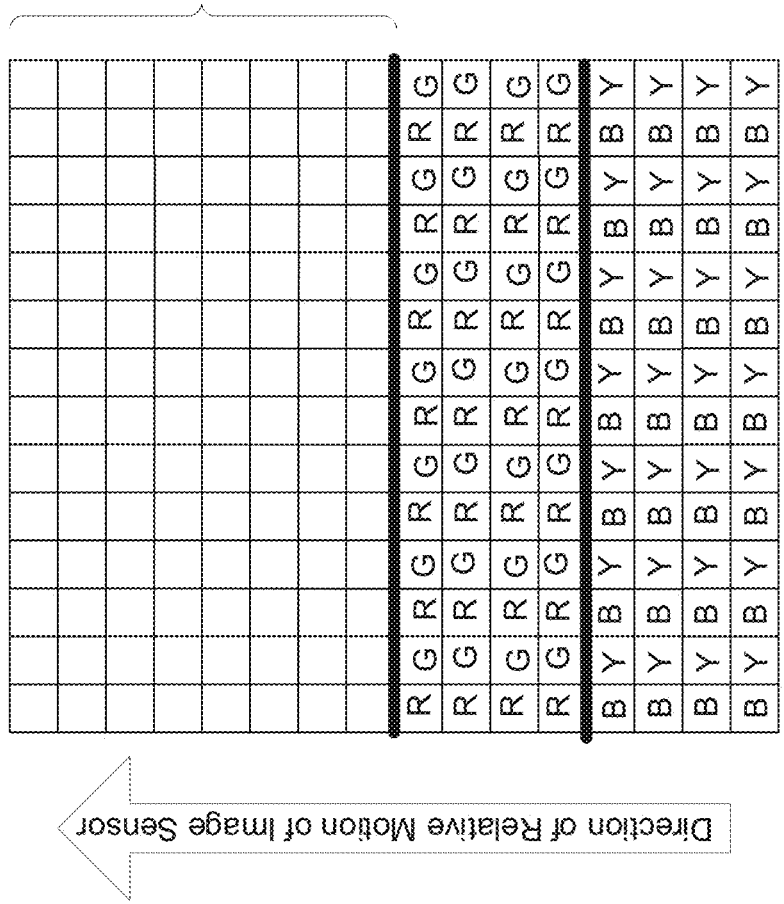
FIG. 7 illustrates a monolithic CCD image sensor that includes a monochrome region, an RG imaging region, and a B-NIR imaging region, each being compatible with the implementation of TDI imaging techniques in accordance with certain embodiments of the invention. In particular, columns within each distinct region are associated with a single color filter. In this way, the electric charge can be more straightforwardly accumulated from each pixel within each column as multiple row shifts are not required to perform TDI imaging in the illustrated configuration.

FIG. 7 illustrates yet another embodiment whereby three distinct imaging regions are defined: a monochrome region, a RG region, and a B-NIR region. In this embodiment, each of the pixels in the same column are associated with a same color filter type; accordingly, electrical charge from each pixel within a same column in a respective imaging region can be accumulated. As can readily be appreciated, combining pixels from different spectral bands in a single row can decrease the resolution of resulting images. The decrease in resolution, however, can come at the benefit of doubling the period of time in which intensity information is accumulated via TDI imaging techniques.

Figure 8:
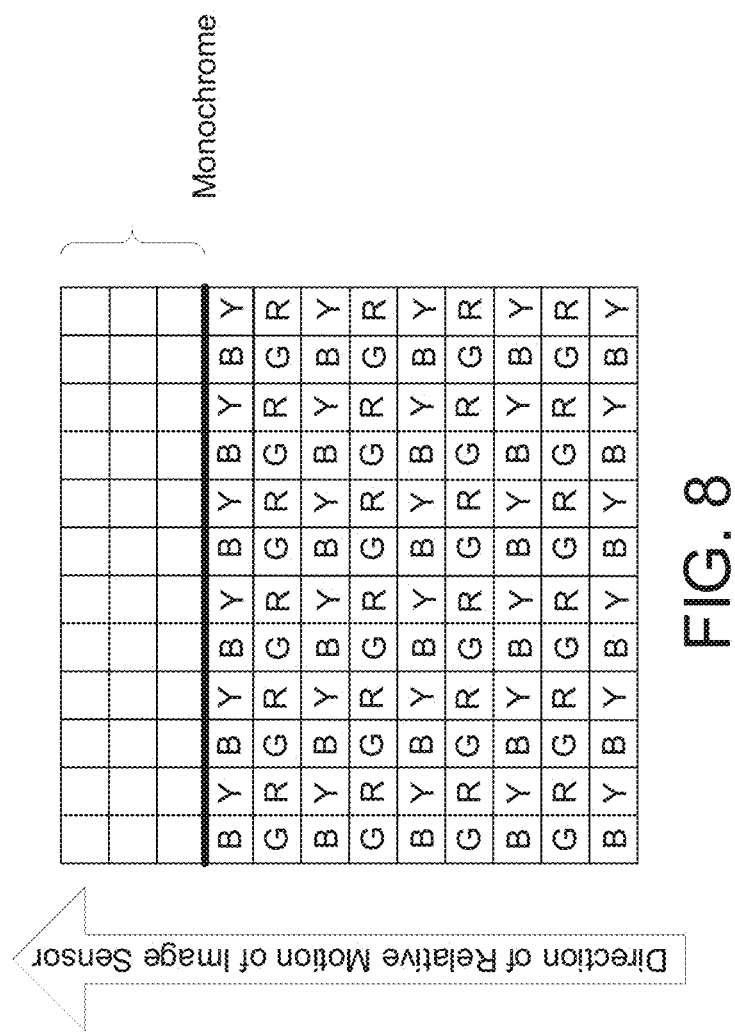
FIG. 8 illustrates a monolithic CCD image sensor that includes a monochrome region, and an RGB-NIR region, where each of the monochrome region and RGB-NIR region are characterized by a different number of rows, each region being compatible with the implementation of TDI imaging techniques in accordance with certain embodiments of the invention.

As can be gleaned from the above examples, the distinct imaging regions do not have to be characterized by equal heights. Rather, each distinct imaging region can include any appropriate number of rows. As alluded to above, a 'taller' imaging region can allow for more integration/exposure time for a respective imaging region and/or imaging of discrete wavelengths within a spectral band using a mosaicked filter pattern. Thus, for instance, if a particular distinct imaging region is characterized by a low sensitivity, it can be made to include more rows of pixels and thereby allow a longer integration time that can counteract the relatively low sensitivity. For example, in many embodiments, monolithic CCD image sensors include a first distinct imaging region operable to image that portion of the electromagnetic spectrum corresponding with near-IR, and a second distinct imaging region operable to image the visible light portion of the electromagnetic spectrum; and the first distinct imaging region is made to have three times as many rows as the second distinct imaging region. This can allow the first distinct imaging region to have an exposure time that is three times as long as the second distinct imaging region. FIG. 8 illustrates yet another example of distinct imaging regions being characterized by different numbers of rows. In particular, FIG. 8 depicts a monolithic CCD image sensor divided into two unequal regions: a narrower monochrome region, and a wider RGB-NIR region.

Figure 9A:
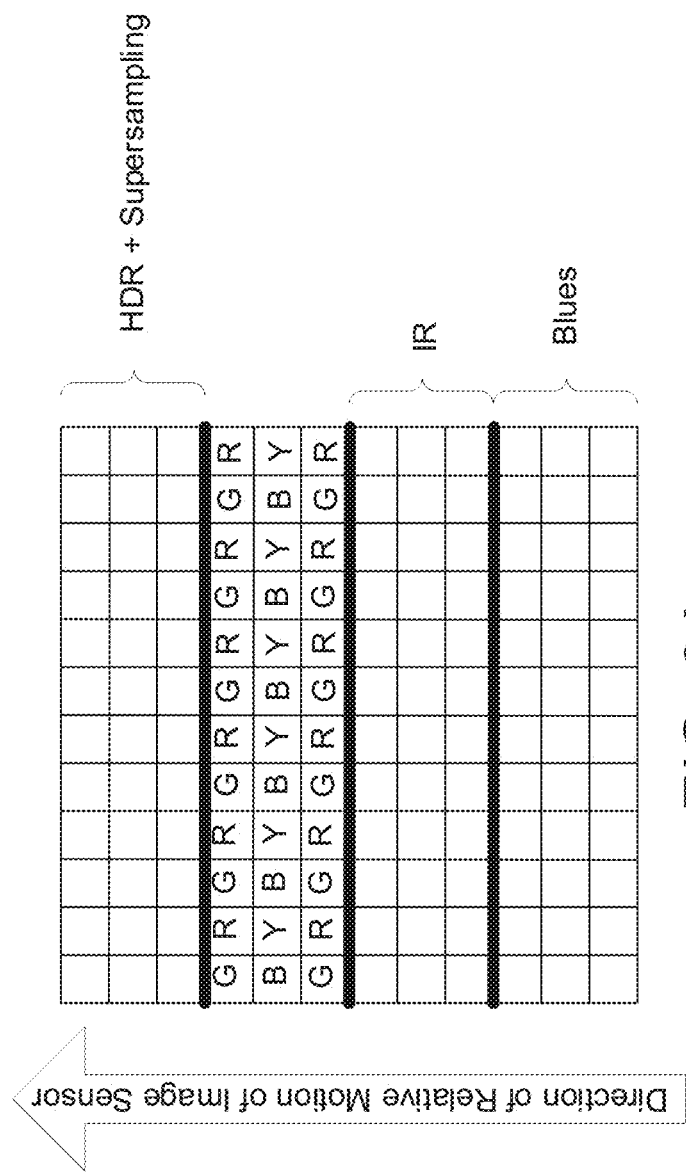
FIG. 9A illustrates a monolithic CCD image sensor that includes an HDR+supersampling region, an RGB-NIR color imaging region, an infrared imaging region, and a region for imaging blues, each being compatible with the implementation of TDI imaging techniques in accordance with certain embodiments of the invention.
Figure 9B:
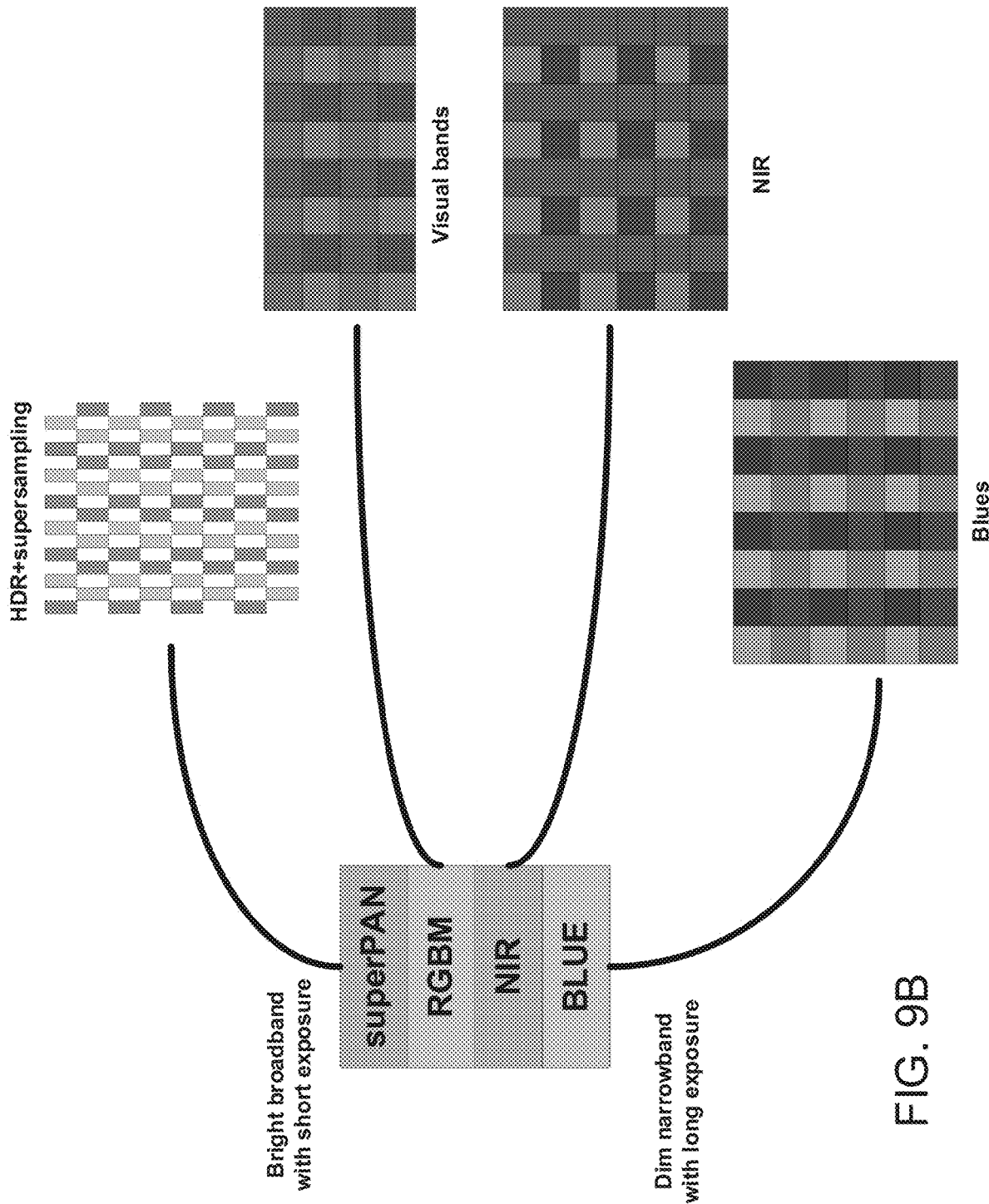
FIG. 9B illustrates a monolithic CCD image sensor that includes an HDR+supersampling region, a visual bands (RGBM) region, a NIR region, and a region for imaging blues, each being compatible with the implementation of TDI imaging techniques in accordance with certain embodiments of the invention.

While FIGS. 5-8 depict a monolithic CCD image sensor characterized by monochrome and color imaging regions, CCD image sensors can include any type of imaging regions in accordance with various embodiments of the invention. For example, FIG. 9A illustrates a monolithic CCD image sensor characterized by four distinct imaging regions in accordance with certain embodiments of the invention: an RGB-NIR region; an IR region; a region for imaging blues; and an HDR+'supersampling' region. The RGB-NIR region can acquire color information, while the infrared region and the blues region can acquire infrared and ultraviolet information respectively. The HDR+supersampling region can acquire image data that can be used to construct a high dynamic range image, and also acquire supersampled image data (HDR imaging and supersampling are discussed in greater detail below). A similar CCD image sensor characterized by four distinct regions in accordance with various embodiments of the invention is shown in FIG. 9B. The specific imaging regions include an HDR+'supersampling' region, a RGB region for imaging visible light, an NIR region including a mosaicked 2 pixel×2 pixel pattern of filters and a region for imaging blues including a mosaicked 2 pixel×2 pixel pattern of filters.

Figure 9D:
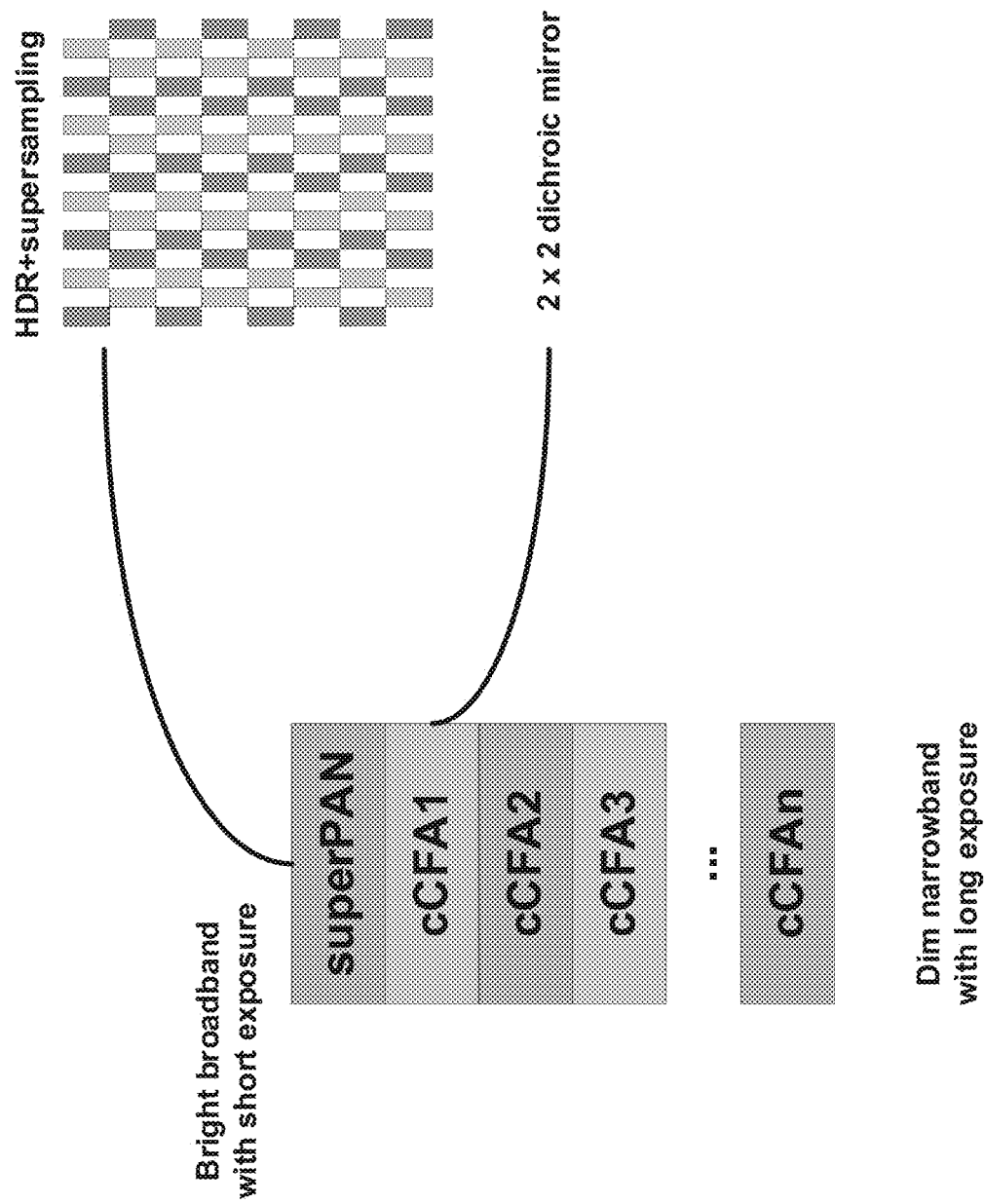
FIG. 9D conceptually illustrates monolithic CCD image sensors that include a panchromatic region that can be configured for HDR and super-sampling, and a plurality of narrowband regions that are each patterned with a mosaic of a dichroic mirror color filter pattern, each being compatible with the implementation of TDI imaging techniques in accordance with certain embodiments of the invention.

While FIGS. 9A and 9B illustrate distinct imaging regions for visible light, infrared, and blues, in many embodiments, distinct imaging regions for imaging a narrowband of the electromagnetic spectrum can be implemented, e.g. a subportion of the infrared region of the electromagnetic spectrum. For example, some narrowband portions of the electromagnetic spectrum may be correlated with scientific data; accordingly distinct imaging regions can be implemented targeting these portions. A CCD image sensor including distinct regions for imaging red, green, near infrared, and blue wavelengths and two regions for performing panchromatic imaging with different exposure times to achieve high dynamic range imaging in accordance with an embodiment of the invention is illustrated in FIG. 9C. In the illustrated embodiment, the exposure time varies with region based upon the anticipated intensity of light within imaged scenes and/or the narrowness of the spectral bands imaged by specific pixels within an imaging region. The architecture illustrated in FIG. 9C can be generalized to any number of imaging regions having different exposure times as shown in FIG. 9D, which also includes an HDR+'supersampling' region. As can be appreciated, the variety in the types of imaging region that can be provided upon a CCD image sensor in accordance with various embodiments of the invention are largely only restricted by the number of rows provided on the CCD image sensor, the number of lanes from which pixel data can be buffered/read out concurrently and/or the requirements of a given application. Examples of specific spectral bands that may be of interest in various imaging applications and for which imaging regions can be created on a CCD image sensor in accordance with any of a number of different embodiments of the invention are provided in the table shown in FIG. 9E.

The Red Edge I, Red Edge II, Near Infrared I, Near Infrared II, and Near Infrared III bands listed in FIG. 9E can open up many new use cases in agriculture and natural resources. The Costal Blue or Coastal Aerosol bands can be useful for counting whale populations, bathymetry, ocean color observation, marine vegetation, monitoring chlorophyll concentrations and suspending sediments in water, as well as phytoplankton and algae blooms. In addition, these bands can be sensitive to clouds, smoke, and haze and can be used for filtering out images in which a scene is occluded by clouds during image processing. The Water Vapor band listed in FIG. 9E is a band in which light is strongly absorbed by water vapor and can be useful for performing atmospheric correction and estimating water vapor content.

While specific spectral bands are described above and with reference to FIG. 9E, filters can be utilized to form an imaging region in which TDI techniques can be utilized to acquire useful information from any appropriate spectral band in accordance with various embodiments of the invention. Generally, as can be appreciated, the pixels within each constituent region can be specifically adapted to receive respective electromagnetic waves. In this way, higher quality image data can be obtained at the individual pixel level.

Referring again to the various CCD image sensors above, many refer to image regions that incorporate filters that enable HDR imaging. FIG. 10 illustrates an HDR filter that can be applied in conjunction with at least one distinct imaging region in accordance with an embodiment of the invention. In particular, FIG. 10 illustrates a mosaic of high, medium, and low transmissivity filters. Such a filter can be used in connection with any of a variety of distinct imaging regions, including those defined by an RGB-NIR color filter pattern, those adapted to image the infrared portion of the electromagnetic spectrum, those adapted to image the ultraviolet portion of the electromagnetic spectrum, and those adapted to perform monochrome imaging. The varying transmissivity can result in the acquisition of a more diverse set of image data, which can be used to construct a high dynamic range image. In some embodiments, a CCD image sensor includes two RGB-NIR regions, one of which is further associated with an HDR filter. While an HDR filter characterized by low, medium, and high transmissivity filters is depicted, it should be clear that any suitable HDR filter can be implemented in accordance with embodiments of the invention. For example, in some embodiments, HDR filters are characterized by filters of two transmissivity values. In some embodiments, a mosaiced HDR filter is applied uniformly across the entirety of the monolithic CCD image sensor. In some embodiments, HDR-like image data can be captured without the use of a discrete HDR filter by varying the exposure time for individual pixels. For example, where greater tranmissivity is desired for a particular pixel, that pixel can image for a greater duration; this will allow more electromagnetic radiation to impinge on the pixel. Similarly, where lesser transmissivity is desired, a respective pixel can be made to image for a shorter duration. In this way, greater diversity in image data can be achieved. As can be appreciated, the monolithic CCD image sensor can operate to accumulate charge only of pixels similarly disposed, e.g. having a same color filter type and having a same transmissivity filter type.

Figure 11:
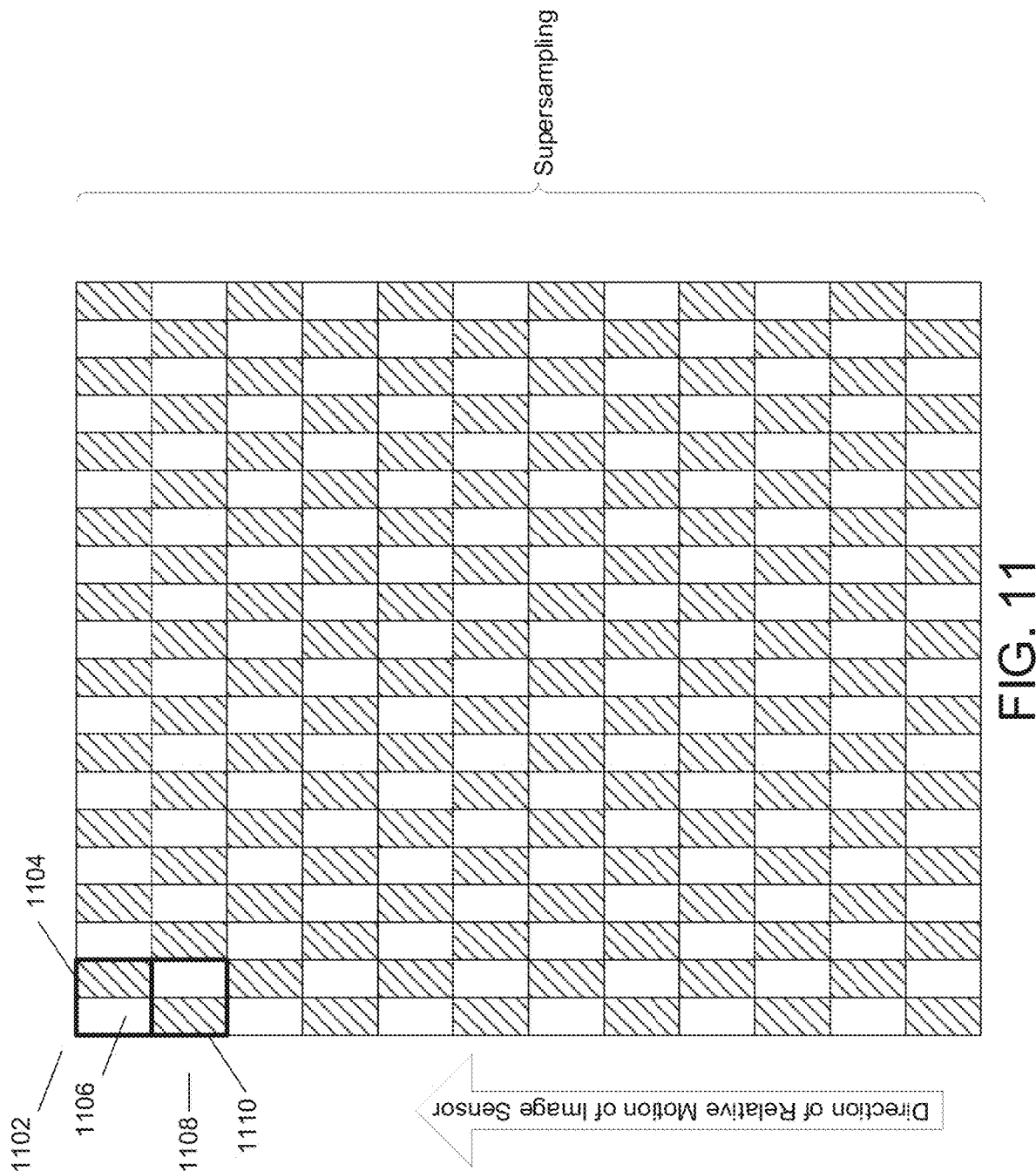
FIG. 11 illustrates the concept of supersampling that can be implemented on a monolithic CCD sensor characterized by multiple distinct imaging regions, each region being compatible with the implementation of TDI imaging techniques in accordance with certain embodiments of the invention.

FIG. 11 illustrates the application of supersampling techniques. In other contexts, the term supersampling is utilized to describe the integration of accumulated charge by multiple pixels in a CCD image sensor during TDI. It should be appreciated that the term supersampling, as utilized herein, instead refers to sampling using a fraction of the active area of a pixel on the CCD image sensor during TDI to achieve increased resolution. In FIG. 11 pixels 1102 and 1108 are highlighted. When light impinges on pixel 1102, the pixel is manipulated such that the pixel responds to light impinging on one half of the pixel 1104; the pixel does not react to light impinging on the other half of the pixel 1106. In other words, the pixel is being biased and/or the pixel is fabricated at a reduced fill factor and/or is masked using a light blocking material such that it only detects incident photons using a fraction (e.g. half) the area of the pixel 1104. Subsequently, in accordance with the TDI Imaging protocol, when the adjacent pixel 1108 is illuminated by the same aspect of the scene, the pixel 1108 responds to light impinging the opposite half of the pixel 1110. Relatedly, any light impinging on the other half 1112 does not result in the accumulation of charge. This pattern can be repeated for the corresponding row of pixels. As can be appreciated, when the stored electric charge is accumulated, it is done so for corresponding alternating rows. In this way, it can be seen that by controlling and/or fabricating the pixels in this manner, the resolution of the respective distinct imaging region can be effectively doubled.

In many instances, to facilitate supersampling, a respective monolithic CCD image sensor is associated with compatible optics. For example, the modulation transfer function (MTF) of the optics can be relatively increased so that the MTF is sufficient to resolve detail at a half pixel width. This may introduce aliasing into the image data captured by any regions that are not performing supersampling. This can be mitigated by implementing optics that have varying MTF, or through image processing.

The depicted supersampling mechanics can be implemented by any of the constituent imaging regions within a monolithic CCD image sensor in accordance with various embodiments of the invention. In some embodiments, the entire CCD image sensor is operable to implement supersampling. In many embodiments, supersampling is implemented with respect to only certain of the distinct imaging regions. In many embodiments, supersampling is performed in conjunction with transmissivity filters, such as the HDR filter pattern seen in FIG. 10.

As can be appreciated, the above-described systems and techniques are broad, and enable much flexibility. For example, a monolithic CCD image sensor can include any number of constituent imaging regions in accordance with various embodiments of the invention. Moreover, they can each be characterized by differing (or the same) numbers of rows and/or shifts of different (or the same) numbers of rows during TDI. And they can further be implemented in conjunction with transmissivity filters and/or supersampling techniques. Accordingly, it can be appreciated that the described systems and techniques can enable robust imaging, and can be used to acquire information-rich data.

In many embodiments, such camera systems are further operable to implement TDI imaging techniques in each of two directions (e.g. either 'up' columns of pixels or 'down' columns of pixels) for each of multiple distinct imaging regions, and this aspect is discussed in greater detail below.

Configurable TDI Imaging Technique Implementation

In many instances, satellites rely heavily (if not exclusively) on solar power. Accordingly, in many instances it may be requisite for a respective satellite to invert its orientation in relation to the Sun so as to enhance incident solar flux. In many cases, this reorientation may involve rotating the camera system's field of view relative to the earth. FIG. 12 illustrates this circumstance. In particular, it is illustrated that at a first time t0 as a satellite is orbiting earth, its onboard solar panels are directly face the sun. As it orbits, at time t1, the solar panels are no longer facing the sun; consequently, at time t2, the satellite reorients so that its solar panels face the sun, and thereby enhances power generation. As can be seen, this can involve inverting the field of view of the camera system as it is imaging the earth. And as can be appreciated, unless mitigating steps are taken, this can disrupt TDI imaging technique protocols. Accordingly, in many embodiments of the invention, camera systems are implemented whereby TDI imaging techniques can be implemented in each of two directions (e.g. 'up' columns of pixels or 'down' columns of pixels). In this way, the camera system can accommodate such a reorientation of the camera system. In many embodiments, this can be achieved by having the CCD image signal processor configure the CCD image sensor to either shift the accumulated intensity information up the column of pixels (i.e. in a first direction) or down the column of pixels (i.e. in a second opposite direction) as appropriate in accordance with TDI imaging techniques. The determination of whether to shift the charge up or down the column of pixels can be based on positional information in relation to the sun.

In many embodiments, the described camera systems can be made further robust by incorporating adaptability with respect to imaging parameters, and this aspect is discussed in greater detail below.

Adaptable TDI Imaging Techniques

In many embodiments, camera systems are configured to augment the implemented TDI imaging techniques based on applicable context. In this way, imaging techniques can be made to be more efficient, and image data can be viably acquired irrespective of lighting and/or satellite trajectory. For example, in many embodiments, a camera system is made to operate in conjunction with 'lookup tables,' which can contain suitable imaging parameters based on satellite location, trajectory, field of view, and/or any other relevant parameters. The 'lookup tables' can be stored onboard within the satellite, or can be accessed via a communication link with a ground station. For example, where it is known that a camera system is imaging a relatively bright location, a 'lookup table' may be used in adjusting the camera system to implement relatively short integration times, since longer exposures may not be necessary to receive sufficient electromagnetic radiation. In one embodiment, the lookup tables are generated on-orbit based on ranging and geolocation information derived from sensor data, GPS readings and/or ground priors. Note that a shorter integration time may be suitably associated with accumulating intensity information over fewer rows for a respective imaging region. In addition and/or alternatively, the same number of rows can be utilized to accumulate intensity information via TDI. However, the period of time over which each pixel accumulates charge is reduced relative to the rate at which accumulated intensity information is shifted between rows of pixels. On the other hand, where it is known that a camera system is imaging a relatively dim location, the camera system may be adjusted to implement longer integration times, so as to enable more suitable imaging accounting for the relatively low light. As can be appreciated, the imaging parameters can also be based on 'time of day,' i.e. presence of sunlight on the scene being imaged: where more sunlight is present, shorter integration times may be used.

In many embodiments, TDI imaging parameters can be adjusted based on the position and trajectory within an elliptical orbit. Of course, it should be appreciated that while several relevant parameters are mentioned, the imaging parameters of a camera system can be adjusted based on any relevant parameters in accordance with various embodiments of the invention. Note that the imaging parameters can be dynamically reconfigured with any suitable frequency. For example, in many embodiments, the imaging parameters can be adjusted every 5-10 frames. While the discussion above references adjustment based upon lookup tables, in a number of embodiments determinations of required adjustments are made in real time based upon sensor information. In certain embodiments, optical flow cameras are included in the camera system to enable precise measurement of the motion of the main sensor used to perform TDI relative to the scene. As can readily be appreciated, any of a variety of additional sensor systems can be utilized to determine the appropriate rate at which to shift accumulated intensity information between rows, integration time, and/or the number of rows over which to accumulate intensity information for each of the distinct regions of an image sensor used to perform TDI in accordance with various embodiments of the invention. Accordingly, the specific manner in which an application processor within a satellite determines an updated set of imaging parameters to provide to a microcontroller and/or FPGA that is coordinating TDI and/or controlling readout of accumulated intensity information from a CCD image sensor in accordance with an embodiment of the invention is typically dependent upon the requirements of a given imaging application. In several applications, a strategy is adopted that features frame to frame adjustment of camera settings (exposure times, analog gains, etc.) to accommodate rapid changes in altitude or scene brightness.

Although the present invention has been described in certain specific aspects, many additional modifications and variations would be apparent to those skilled in the art. For instance, any of a variety of distinct imaging regions can be implemented in accordance with embodiments of the invention. It is therefore to be understood that the present invention may be practiced otherwise than specifically described. Thus, embodiments of the present invention should be considered in all respects as illustrative and not restrictive. Furthermore, the scope of the invention should be determined not by the embodiments illustrated and described, but by the appended claims and their equivalents.

What is claimed is:
1. A camera system comprising:
an optical system;
a CCD image sensor, itself comprising a plurality of pixels that define at least two distinct imaging regions; where a first distinct imaging region is configured to image a scene in a single channel; and a second distinct imaging region is configured to image a scene in multiple channels, and where the pixels within each distinct imaging region are configured to image a scene differently than at least one other distinct imaging region;
a CCD image signal processor;
a microprocessor;
an amplifier operable to amplify accumulated intensity information read out from the CCD image sensor; and
an analog to digital converter operable to receive amplified accumulated intensity information, and output a digital representation of the accumulated intensity information;
wherein the optical system is configured to focus incident electromagnetic waves onto the CCD image sensor; and
wherein the camera system is operable in a time-delay integration mode whereby time delay-integration imaging techniques are imposed such that the camera system operates to read out accumulated intensity information from each distinct imaging region by repeatedly:
accumulating intensity information in pixels within each row of pixels within a distinct imaging region;
shifting accumulated intensity information to a subsequent row of pixels within the distinct imaging region, where a last row of pixels does not have a next row of pixels and instead shifts accumulated intensity information into an array of accumulators; and
reading out accumulated intensity information from the array of accumulators.

2. The camera system of claim 1, wherein the second distinct imaging region employs a filter pattern including color filters selected from the group consisting of at least one red color filter, at least one green color filter, at least one blue color filter, and at least one yellow color filter.

3. The camera system of claim 1, wherein the second distinct imaging region includes a repeated pattern of filters.

4. The camera system of claim 3, wherein the repeated pattern of filters repeats a pattern of filters applied to pixels in a region of at least 2 pixels×at least 2 pixels.

5. The camera system of claim 3, wherein the repeated pattern of filters repeats a pattern of filters applied to pixels in a region of 2 pixels×2 pixels.

6. The camera system of claim 5, wherein the pattern of filters applied to pixels in a region of 2 pixels×2 pixels applies the same filter to at least two of the pixels and a different filter to at least one of the pixels.

7. The camera system of claim 6, wherein the pattern of filters is a Bayer pattern.

8. The camera system of claim 6, wherein the pattern of filters comprises filters that select different wavelengths of red light.

9. The camera system of claim 6, wherein the pattern of filters comprises filters that select different wavelengths of blue light.

10. The camera system of claim 6, wherein the pattern of filters comprises filters that select different wavelengths of green light.

11. The camera system of claim 3, wherein the repeated pattern of filters is a repeated pattern of transmissivity filters.

12. The camera system of claim 11, wherein the transmissivity filters are dichroic filters.

13. The camera system of claim 12, further comprising a primary filter located between the optical system and the CCD image sensor.

14. The camera system of claim 13, wherein the primary filter is a butcher block filter layer comprising a plurality of regions possessing different filtering characteristics.

15. The camera system of claim 11, wherein the repeated pattern of transmissivity filters includes filters having different transmissivity to enable high dynamic range imaging.

16. The camera system of claim 1, wherein the first distinct imaging region is configured to image with a fill factor that is smaller than the fill factor of the pixels in the second distinct imaging region.

17. The camera system of claim 1, wherein at least one of the distinct imaging regions defines a third distinct imaging region configured to image near-infrared electromagnetic radiation.

18. The camera system of claim 1, wherein:
the at least two distinct imaging regions include an imaging region having a repeated pattern of filters that repeats a pattern of filters applied to pixels in a region of at least 2 pixels×at least 2 pixels; and
shifting accumulated intensity information to a next row of pixels within the imaging region having the repeated pattern of filters comprises shifting the accumulated intensity information to a non-adjacent row of pixels.

19. The camera system of claim 1, wherein the single and multiple channels represent a sub-portion or sub-portions of the electromagnetic spectrum.

20. The camera system of claim 1, wherein at least one of the distinct imaging regions defines a third distinct imaging region configured to image ultraviolet electromagnetic radiation.

21. The camera system of claim 1, wherein shifting accumulated intensity information to a next row of pixels within at least one of the distinct imaging regions comprises shifting the accumulated intensity information to an adjacent row of pixels.

22. The camera system of claim 1, wherein shifting accumulated intensity information to a next row of pixels within at least one of the distinct imaging regions comprises shifting the accumulated intensity information to a non-adjacent row of pixels.

23. The camera system of claim 1, wherein the camera system is operable to adjust imaging parameters based upon at least one factor selected from the group consisting of received positioning information, trajectory, and field of view.

* * * * *